United States Patent
Matsumoto et al.

(10) Patent No.: US 10,473,715 B2
(45) Date of Patent: Nov. 12, 2019

(54) IC HANDLER

(71) Applicant: HAPPYJAPAN, INC., Yamagata-shi (JP)

(72) Inventors: Shouhei Matsumoto, Yamagata (JP); Yoshinori Arai, Yamagata (JP); Satoshi Ueno, Yamagata (JP); Keitaro Harada, Yamagata (JP); Masayoshi Yokoo, Yamagata (JP)

(73) Assignee: HappyJapan Inc., Yamagata-Shi, Yamagata (JP)

( * ) Notice: Subject to any disclaimer, the term of this patent is extended or adjusted under 35 U.S.C. 154(b) by 0 days.

(21) Appl. No.: 15/101,389

(22) PCT Filed: Dec. 3, 2013

(86) PCT No.: PCT/JP2013/082485
§ 371 (c)(1),
(2) Date: Jun. 2, 2016

(87) PCT Pub. No.: WO2015/083240
PCT Pub. Date: Jun. 11, 2015

(65) Prior Publication Data
US 2016/0370424 A1    Dec. 22, 2016

(51) Int. Cl.
*G01R 31/28*    (2006.01)
*G01R 1/04*    (2006.01)

(52) U.S. Cl.
CPC ..... *G01R 31/2893* (2013.01); *G01R 31/2867* (2013.01); *G01R 1/0433* (2013.01)

(58) Field of Classification Search
CPC .......................... G01R 31/2893; G01R 1/0433
See application file for complete search history.

(56) References Cited

U.S. PATENT DOCUMENTS

| | | | |
|---|---|---|---|
| 2005/0052176 A1* | 3/2005 | Holt .................... | B25J 9/041 324/750.22 |
| 2007/0200555 A1 | 8/2007 | Mizushima et al. | |

(Continued)

FOREIGN PATENT DOCUMENTS

| | | |
|---|---|---|
| JP | 2000-028681 A | 1/2000 |
| JP | 2011-095169 A | 5/2011 |

(Continued)

*Primary Examiner* — Akm Zakaria
(74) *Attorney, Agent, or Firm* — Knobbe, Martens, Olson & Bear, LLP

(57) ABSTRACT

An IC handler (4) of the present invention is provided with: a contact head (7), which holds a plurality of IC devices, and which presses the IC devices to a plurality of sockets (3); and a movable arm (6) that moves the contact head (7). The movable arm (6) has power supply ports (VO, HO) that are connected to supply sources (VS, HS) of power for generating operations of the contact head (7), and the contact head (7) has a plurality of operating sections (70) that operate with the power, and a supporting section (71), which supports the operating sections (70), and which is removably attached to the movable arm (6). The supporting section (71) of the contact head (7) has: connecting ports (VC, HC) that are removably connected to the supply ports (VO, HO); and supply paths (71*a*, 71*d*) for supplying the power to the operating sections (70) from the connecting ports (VC, HC) connected to the supply ports (VO, HO).

4 Claims, 18 Drawing Sheets

(56) References Cited

U.S. PATENT DOCUMENTS

| | | | | |
|---|---|---|---|---|
| 2009/0189631 A1* | 7/2009 | Shimada | ............ | G01R 31/2893 |
| | | | | 324/757.05 |
| 2012/0112777 A1* | 5/2012 | Aizawa | .............. | G01R 31/2867 |
| | | | | 324/750.08 |
| 2013/0206383 A1* | 8/2013 | Maeda | .................... | F28F 27/00 |
| | | | | 165/253 |
| 2016/0356843 A1* | 12/2016 | Matsumoto | ........ | G01R 31/2887 |

FOREIGN PATENT DOCUMENTS

| | | |
|---|---|---|
| KR | 10-0709827 B1 | 4/2007 |
| KR | 10-2008-0099322 A | 11/2008 |
| WO | WO00/41536 A2 | 7/2000 |

\* cited by examiner

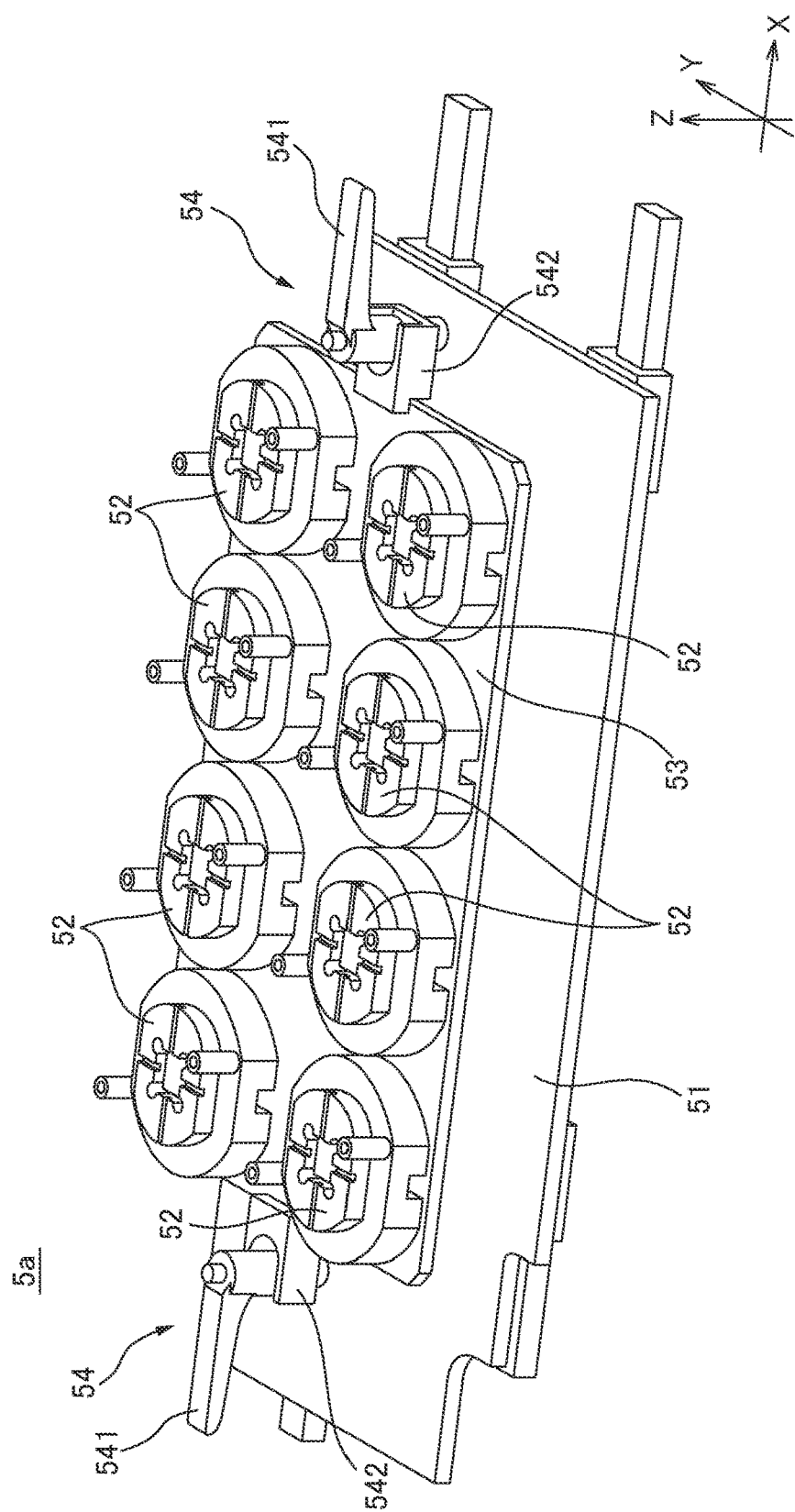

IC HANDLER

TECHNICAL FIELD

The present invention relates to an IC handler for conveying IC devices to a test head having a plurality of sockets.

BACKGROUND ART

In the process of production of IC devices, a test apparatus for performing power-up tests on IC devices is referred to as an "IC tester". Further, a conveyor apparatus for conveying IC devices for power-up tests by an IC tester is referred to as an IC handler. In general, an IC handler is provided with a contact head for holding the IC devices and a robot arm for making the contact head move. In the process of conveyance of IC devices, first, the robot arm makes the contact head move toward the test head of the IC tester. Due to this, the IC devices are inserted into the sockets. Next, the contact head pushes the IC devices in the sockets to thereby electrically connect the IC devices to the test head. Due to this, power-up tests of the IC devices are started.

An IC device in a state inserted into a socket of the test head will be referred to as a DUT (device under test). In general, a test head is provided with a plurality of sockets. Power-up tests of a plurality of DUTs inserted into these sockets can be simultaneously run. In the same way, the contact head of the IC handler is provided with a plurality of clamping sections so as to enable IC devices to be simultaneously inserted into the plurality of sockets. The array of these clamping sections has to be made equal to the array of DUTs at the test head, so if the array of DUTs is changed, it is necessary to change the array of clamping sections in accordance with the new array of DUTs. In this regard, in a conventional IC handler, the individual clamping sections are fastened to the contact head by screws etc., so when changing the array of clamping sections, large scale work of altering the contact head was necessary.

In relation to this, PLT 1 discloses an IC handler provided with a wedge shaped engagement member strongly fastening individual clamping sections (clampers) to the fastening surface of the contact head body. Further, the IC handler of the PLT 1 is provided with a changing mechanism for releasing the engaged state of the engagement member and fastening surface linked with operation of a manual operating member. This engagement member enables individual clamping sections to be changed for each type of IC device. However, the individual clamping sections have various fluid piping and electrical wiring etc. connected to them, so to change the array of the plurality of clamping sections at the contact head, it is necessary to reinstall the piping and wiring corresponding to the new array of the clamping sections. Therefore, even if the individual clamping sections are designed to be easily interchanged, large scale work of altering the contact head is still unavoidable for changing the array of DUTs.

CITATION LIST

Patent Literature

PLT 1: Pamphlet of International Publication No. 2010/109678

SUMMARY OF INVENTION

Technical Problem

An IC handler which enables the array of DUTs to be changed without requiring large scale work of altering a contact head is being sought.

Solution to Problem

According to one aspect of the present invention, there is provided an IC handler conveying a plurality of IC devices to a test head having a plurality of sockets, wherein the IC handler is provided with a contact head for holding a plurality of IC devices and pushing the plurality of IC devices against the plurality of sockets and a movable arm making the contact head move, the movable arm has a supply port of power connected to a supply source of power for enabling operation of the contact head, the contact head has a plurality of operating parts operating due to the power and a support part supporting the plurality of operating parts and attached detachably to the movable arm, and the supporting section has a connection port detachably connected to the supply port and a supply part supplying the power from the connection port connected to the supply port to the plurality of operating parts.

Advantageous Effects of Invention

According to one aspect of the present invention, by just changing a contact head attached to a movable arm to another contact head, the connection port of the other contact head is connected to the supply port of the movable arm side. Therefore, according to one aspect of the present invention, the large scale work of altering the contact head accompanying change of the array of DUTs becomes unnecessary, so it becomes possible to easily handle various arrays of DUTs.

BRIEF DESCRIPTION OF DRAWINGS

FIG. 18 is a perspective view of a loading part of a shift unit in the IC handler of the present embodiment.

DESCRIPTION OF EMBODIMENTS

Figure 1:
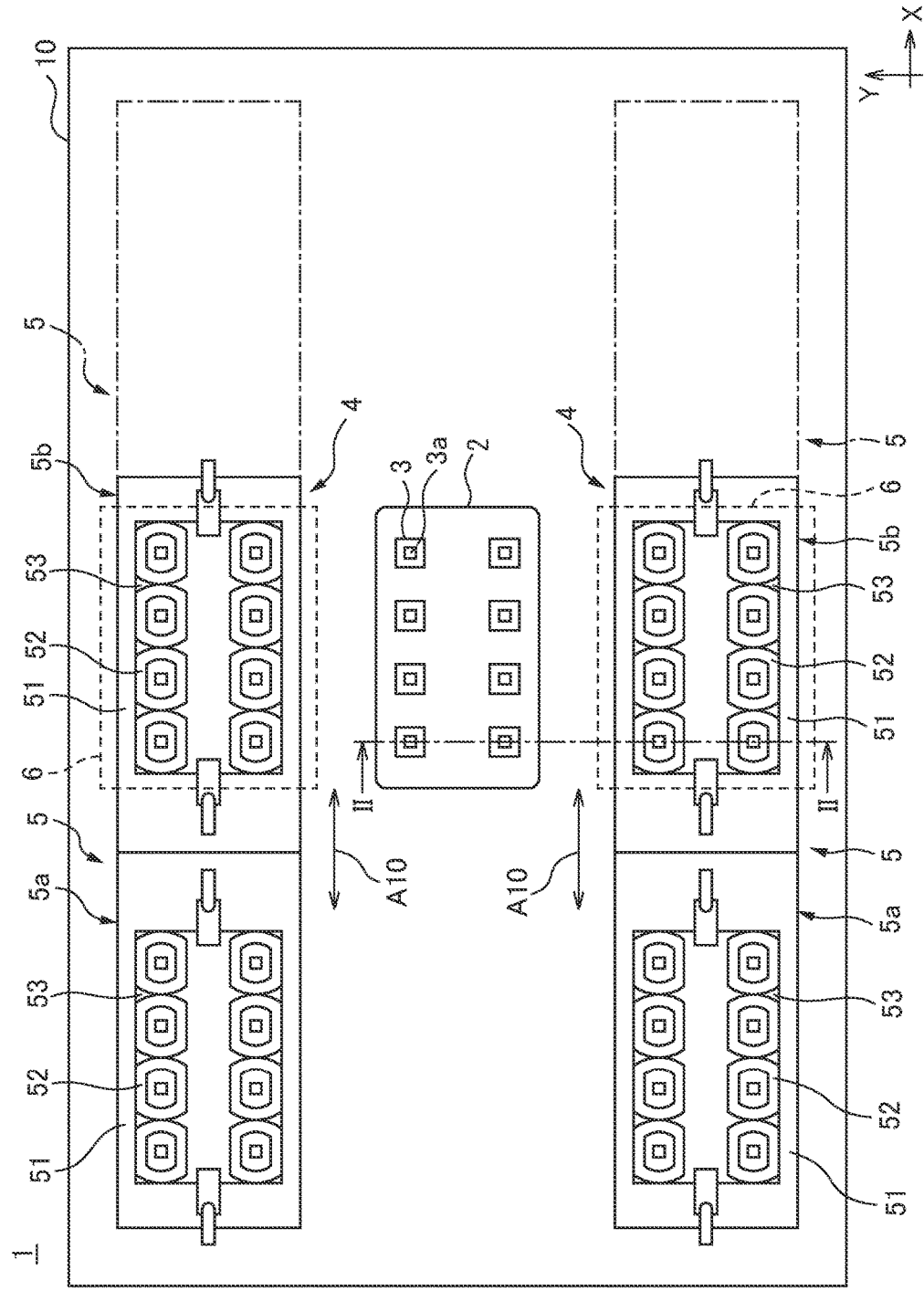
FIG. 1 is a plan view of an IC test system including an IC handler of an embodiment of the present invention.

Below, embodiments of the present invention will be explained in detail referring to the drawings. In these drawings, similar component elements are assigned similar notations. Note that, the following description does not limit the technical scope or meaning of terms of the inventions described in the claims.

Figure 2:
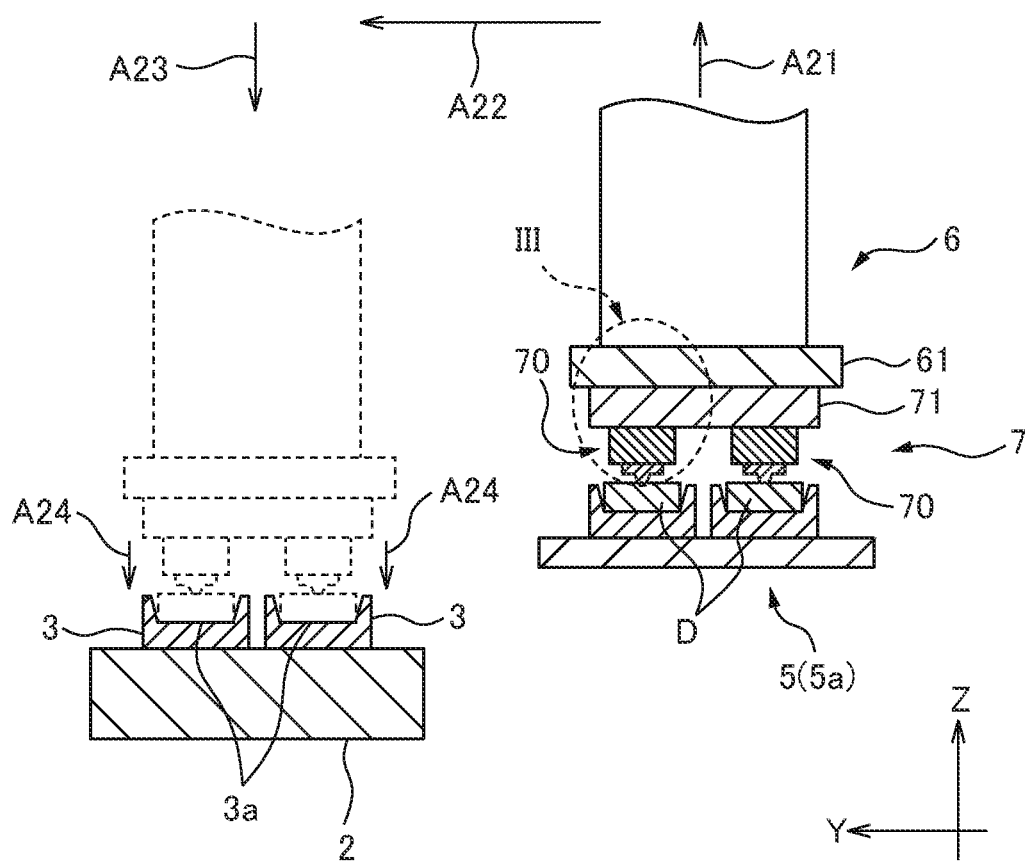
FIG. 2 is a cross-sectional view along the line II-II of FIG. 1.

Referring to FIG. 1 to FIG. 18, IC handlers according to embodiments of the present invention will be explained. FIG. 1 is a plan view of an IC test system 1 including a typical IC handler 4 according to the present embodiment. As shown in FIG. 1, the IC test system 1 comprises a table shaped base 10, a test head 2 mounted at the base 10, and a plurality of sockets 3 arranged at the test head 2. The test head 2 is a test apparatus which performs power-up tests on IC devices inserted at the sockets 3. The individual sockets 3 have carrying surfaces 3a on which the IC devices are placed and are designed to attach DUTs placed on the carrying surfaces 3a to the test head 2. In the following explanation, an IC device in the state inserted in a socket 3 will particularly be referred to as a "DUT". The structures of the individual sockets 3 are also shown in FIG. 2.

The IC handler 4 of the present embodiment is a conveyor device conveying IC devices for power-up tests by the test head 2 of the IC test system 1. The IC test system 1 according to the example of FIG. 1 is provided with a pair of IC handlers 4, 4. These IC handlers 4, 4 are provided with a pair of shift units 5, 5 able to move along the top surface of the base 10 in the direction of the arrow A10 and a pair of movable arms 6, 6 arranged above the base 10. Note that, in the example of FIG. 1, the direction parallel to the direction of movement of the shift units 5, 5 is made the X-direction and the direction perpendicular to the X-direction at the top surface of the base 10 is made the Y-direction (same in other drawings). The test head 2 according to the present example has two lines of sockets 3 side by side in the Y-direction. Each line includes four sockets arranged in the X-direction. That is, the test head 2 according to the present example has a total of eight sockets 3 arranged at it. The carrying surfaces 3a of these sockets 3 are oriented so as to be parallel in both the X-direction and Y-direction. Note that, between the test head 2 and the sockets, a printed circuit board called a "performance board" is arranged. In general, the array of the DUTs at the test head 2 is determined in accordance with the circuit patterns of the performance board.

In the example of FIG. 1, a pair of IC handlers 4, 4 are arranged symmetrically with each other in the Y-direction so as to straddle the sockets 3. The respective IC handlers 4 are configured similar to each other. For this reason, below, only one IC handler 4 will be explained. In the example of FIG. 1, a shift unit 5 of the IC handler 4 has a loading part 5a and an unloading part 5b arranged aligned in the X-direction. The loading part 5a and the unloading part 5b are moved by a not shown drive mechanism in the X-direction. Here, the loading part 5a is a region where pre-test IC devices to be inserted at sockets 3 are placed. The pre-test IC devices are placed by a not shown loading robot at the loading part 5a. Further, the unloading part 5b is a region at which tested IC devices ejected from the sockets 3 are placed. The IC devices placed at the unloading part 5b are unloaded by a not shown unloading robot to trays in accordance with the results of the power-up tests.

In the example of FIG. 1, the loading part 5a and the unloading part 5b have configurations similar to each other, so below only the configuration of the loading part 5a will be explained. As shown in FIG. 1, the loading part 5a according to the present example is provided with a plate-shaped base part 51 able to move in the X-direction, a plurality of holding parts 52 having pockets for holding individual IC devices, and a plate-shaped holder supporting part 53 supporting these holding parts 52. The array of the plurality of holding parts 52 at the holder supporting part 53 matches the array of the sockets 3 at the test head 2. These holding parts 52 are suitably changed according to the type of IC device under test. For this reason, the individual holding parts 52 are called "change kits".

As shown by the arrow A10 in FIG. 1, the shift unit 5 can move in the X-direction between a loading position where the loading part 5a adjoins the sockets 3 and an unloading position where the unloading part 5b adjoins the sockets 3. In the example of FIG. 1, the shift unit 5 present at the unloading position is shown by the solid line, while the shift unit 5 present at the loading position is shown by the one-dot chain line. The shift plate 5 according to the present example moves from the unloading position to the loading position to thereby convey IC devices placed at the loading part 5a to near the sockets 3. Further, the IC devices conveyed to near the sockets 3 are inserted by the movable arm 6 of the IC handler 4 into the sockets 3.

The movable arm 6 according to the example of FIG. 1 is a robot arm able to move in the Y-direction and Z-direction by a not shown drive mechanism. The movable arm 6 according to the present example successively performs an operation for charging pre-test IC devices in the sockets 3 and an operation of ejecting tested IC devices from the socket 3. FIG. 2 is a cross-sectional view along the line II-II of FIG. 1. Note that the Z-direction of FIG. 2 is a direction vertical to both the X-direction and Y-direction of FIG. 1, that is, a direction vertical to the carrying surfaces of the sockets 3 (same in other drawings). As shown in FIG. 2, the front end part of the movable arm 6 according to the present example has a contact head 7 for clamping the IC devices D attached to it. The front end part of the movable arm 6 will be referred to below as a "mounting part 61".

The contact head 7 according to the present example is provided with the function of clamping the IC devices D and the function of pushing the IC devices D against the sockets. It has a plurality of operating parts 70 operating to realize these functions. The array of the plurality of operating parts 70 at the contact head 7 matches the array of the plurality of sockets 3 at the test head 2. Therefore, the contact head 7 according to the present example has two operating parts 70 arranged in the Y-direction. Each row includes four operating parts 70 arranged in the X-direction. That is, the contact head 7 according to the present example has a total of eight operating parts 70. These operating parts 70 are supported by a common supporting section 71. The supporting section 71 is detachably attached to the mounting part 61 of the movable arm 6. Note that, in FIG. 2, the internal structures of the mounting part 61, operating part 70, and supporting section 71 are omitted.

Figure 3:
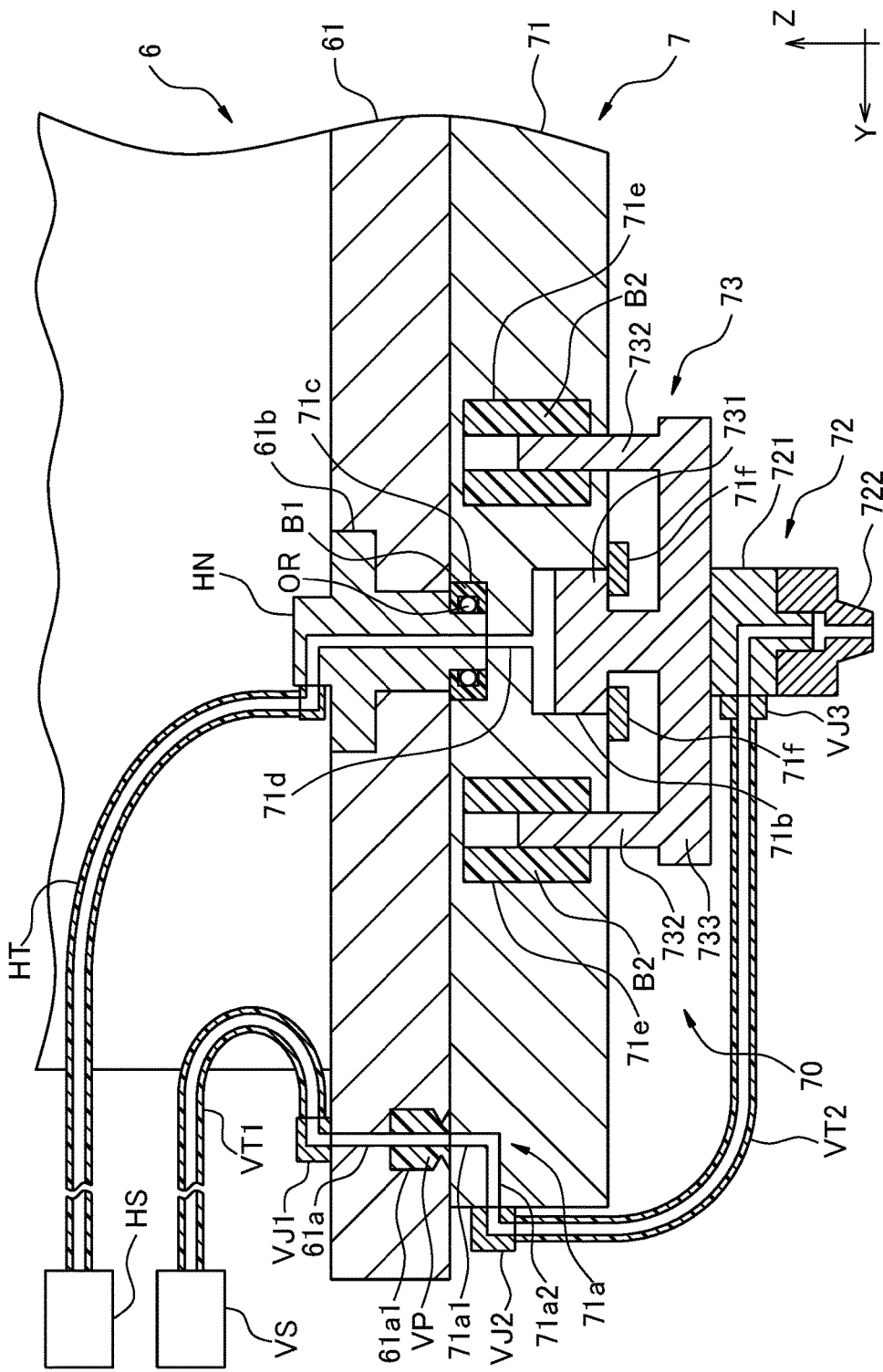
FIG. 3 is a partially enlarged view showing a part III of FIG. 2.

FIG. 3 is a cross-sectional view showing a part represented by the arrow III of FIG. 2, that is, showing enlarged the vicinity of one operating part 70. As shown in FIG. 3, the operating part 70 according to the present example is provided with a clamping section 72 having the function of clamping an IC device D and a pushing section 73 having the function of pushing an IC device D against a socket 3. The clamping section 72 according to the present example has a vacuum nozzle 721 operating by vacuum and is designed to pick up and hold an IC device D by vacuum supplied from a power supply source comprised of a vacuum supply source VS, for example, a vacuum pump. The clamping section 72 according to the present example is connected to a vacuum supply source VS by the vacuum route explained below. Below, the vacuum supply source VS at the vacuum route will be called "upstream" while the clamping section 72 side will be called "downstream".

As shown in FIG. 3, upstream in the vacuum route, a vacuum supply source VS and a first joint VJ1 attached to the mounting part 61 is connected by a first vacuum tube VT1. Next, the first joint VJ1 of the mounting part 61 and the second joint VJ2 attached to the supporting section 71 are connected by supply paths 61a, 71a running through the mounting part 61 and supporting section 71. Here, the supply path 61a of the mounting part 61 extends in the Z-direction and has an expanded part 61a near the end part at the downstream side. At the expanded part 61a1, a ring-shaped vacuum pad VP is fit. Further, the supply path 71a of the supporting section 71 has an upstream side first part 71a1 extending in the Z-direction and a downstream side second part 71a2 extending in the Y-direction. Next, the second joint VJ2 of the supporting section 71 and the third joint VJ3 attached to the clamping section 72 are connected by a second vacuum tube VT2. Note that, at the front end part of the clamping section 72, a contact member 722 contacting the IC device is detachably attached. The contact member 722 is suitably changed according to the type of IC device under test. For this reason, the contact member 722 is called a "change kit" in the same way as the above-mentioned holding parts 52.

As shown in FIG. 3, the pushing section 73 according to the present example has a piston 731 operating by hydraulic pressure and is designed to push an IC device against a socket 3 by hydraulic pressure supplied from a power source comprised of a hydraulic source HS, for example, a compressor. More specifically, the piston 731 of the pushing section 73 is inserted in a columnar shaped recessed part 71b formed at the bottom surface of the supporting section 71 and receives hydraulic pressure so as to slide in the Z-direction so as to push an IC device against a socket 3. The pushing section 73 according to the present example is connected by a fluid route explained below to the hydraulic supply source HS. Below, the hydraulic supply source HS side at the fluid route will be called "upstream" and the pushing section 73 side will be called "downstream".

As shown in FIG. 3, upstream of the fluid route, the hydraulic supply source HS and the hydraulic nozzle HN attached to the mounting part 61 are connected by a fluid tube HT. The hydraulic nozzle HN is inserted into the Z-direction through hole 61b formed in the mounting part 61. The end part of the downstream side of the hydraulic nozzle HN sticks out from the through hole 61b and is inserted into a recessed part 71c formed at the top surface of the supporting section 71. Between the front end part of the hydraulic nozzle HN and the recessed part 71c, a circular ring-shaped bush B1 fit in the recessed part 71c is interposed. Further, at the inner circumferential surface of the bush B1, a ring-shaped groove is formed for an O-ring. In this ring shaped groove, an O-ring OR is fit. Next, between the bottom surfaces of the recessed part 71c and recessed part 71b at the supporting section 71, a supply path 71d extending in the Z-direction is formed so as to run through the supporting section 71.

As shown in FIG. 3, the pushing section 73 according to the present example is provided with the above-mentioned piston 731, a plurality of guide rods 732 extending in the Z-direction and arranged so as to straddle the piston 731, and a flat plate-shaped bottom part 733 coupling the piston 731 and plurality of guide rods 732. In the present example, at the bottom surface of the supporting section 71, a plurality of recessed parts 71e in which cylindrical bushes B2 are inserted are formed. At these bushes B2, guide rods 732 is inserted to be able to slide in the Z-direction. Further, the guide rods 732 are designed to slide along the inner circumferential surfaces of the bushes B2 in the Z-direction so as to guide the piston 721 in the Z-direction. Further, at the bottom surface of the supporting section 71, a stopping member 71f for stopping the piston 731 at the bottommost point is attached.

Figure 4:
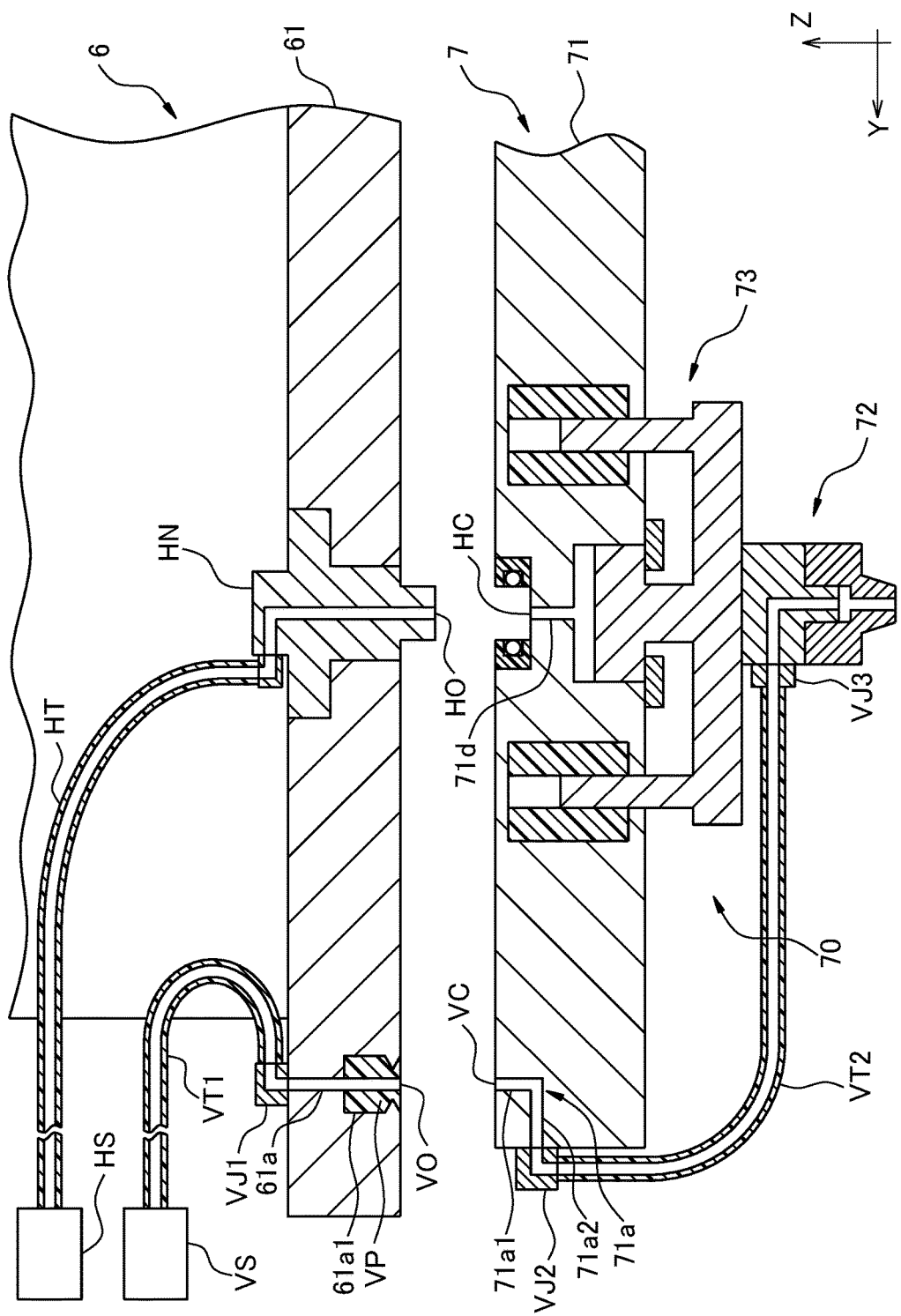
FIG. 4 is a partially enlarged view similar to FIG. 3 and shows the state where the contact head is detached from a movable arm.

As explained above, the contact head 7 according to the present example is detachably attached to the mounting part 61 of the movable arm at the supporting section 71. FIG. 4 is a cross-sectional view similar to FIG. 3 and shows the state where the contact head 7 is detached from the movable arm 6. As shown in FIG. 4, a downstream side end part of a vacuum pad VP of the mounting part 61 forms a vacuum supply port VO for the contact head 7. The upstream side end part at the supply path 71a of the supporting section 71 forms a connection port VC connected to the vacuum supply port VO. In the same way, the downstream side end part at the hydraulic nozzle HN of the mounting part 61 forms a hydraulic supply port HO for the contact head 7. The upstream side end part at the supply path 71d of the supporting section 71 forms a connection port HC connected to the hydraulic supply port HO.

Referring again to FIG. 2, the operation when the movable arm 6 according to the present example charges pre-test IC devices into the sockets 3 will be explained. The movable arm 6 of the present example moves the contact head 7 according to the following procedure to thereby charge pre-test IC devices D into the socket 3. First, as shown by the solid line of FIG. 2, when the shift unit 5 is present at the loading position, the contact head 7 is moved in the Y-direction and Z-direction whereby operating sections 70 (clamping sections 72) are made to abut against the IC devices D on the loading part 5a. Next, the operating sections 70 (clamping sections 72) clamp ID devices D by vacuum pickup, then, as shown by the arrow A219 of FIG. 2, the contact head 7 is moved in the Z-direction whereby the IC devices D are lifted up from the loading part 5a.

Furthermore, as shown by the arrow A22 of FIG. 2, the contact head 7 is moved in the Y-direction whereby the IC devices D are aligned with the socket 3 in the Y-direction. Next, as shown by the arrow A23 of FIG. 2, the contact head 7 is moved in the Z-direction whereupon the IC devices D are placed at the carrying surfaces 3a of the sockets 3. Due to this, the IC devices D finish being placed at the sockets 3. The state at this time is shown by the broken line of FIG. 2.

After that, as shown by the arrow A24 of FIG. 2, the operating sections 70 (pushing sections 73) move in the Z-direction whereby the IC devices D inside the sockets 3 are pushed against the test head 2. Due to this, the IC devices D inside the sockets 3 are electrically connected with the test head 2 and the power-up tests of the IC devices D are started. When the power-up tests of the IC devices D are started, the shift unit 5 is moved from the loading position to the unloading position. Further, when the power-up tests of the IC devices inside the sockets 3 are completed, the contact head 7 is moved in the opposite direction to the direction shown by the arrows A21, A22, and A23 of FIG. 2 whereby the IC devices D are placed at the unloading part 5b. Further, the pickup states by the operating sections 70 (clamping sections 72) are released, whereby the operation for ejecting the IC devices D from the sockets 3 is completed. This series of steps will sometimes be referred to below as the "insertion and ejection process" of IC devices D.

Note that, for simplification of the explanation, FIG. 2 shows the shift unit 5 and movable arm 6 of only one IC handler 4, but the shift unit 5 and movable arm 6 of the other IC handler 4 can operate in the same way as these. That is, the shift units 5, 5 and movable arms 6, 6 of the pair of IC handlers 4, 4 can alternately perform the above-mentioned insertion and ejection process. Due to this, the frequency of replacement of IC devices at the sockets 3 is increased, so the operating rate of the test head 2 can be improved.

In the above way, the movable arm and contact head of the IC handler of the present embodiment work together to successively perform the insertion and ejection process of IC devices D. However, when the array of DUTs at the test head 2 changes along with the change of the performance board etc., it is necessary to change the array of operating sections 70 at the contact head 7 in accordance with this. For this reason, the IC handler 4 of the present embodiment is designed to enable the contact head 7 attached to the movable arm 6 to be easily replaced with another contact head 70 with a different array of operating sections 70. This point will be explained in detail below.

Figure 5:
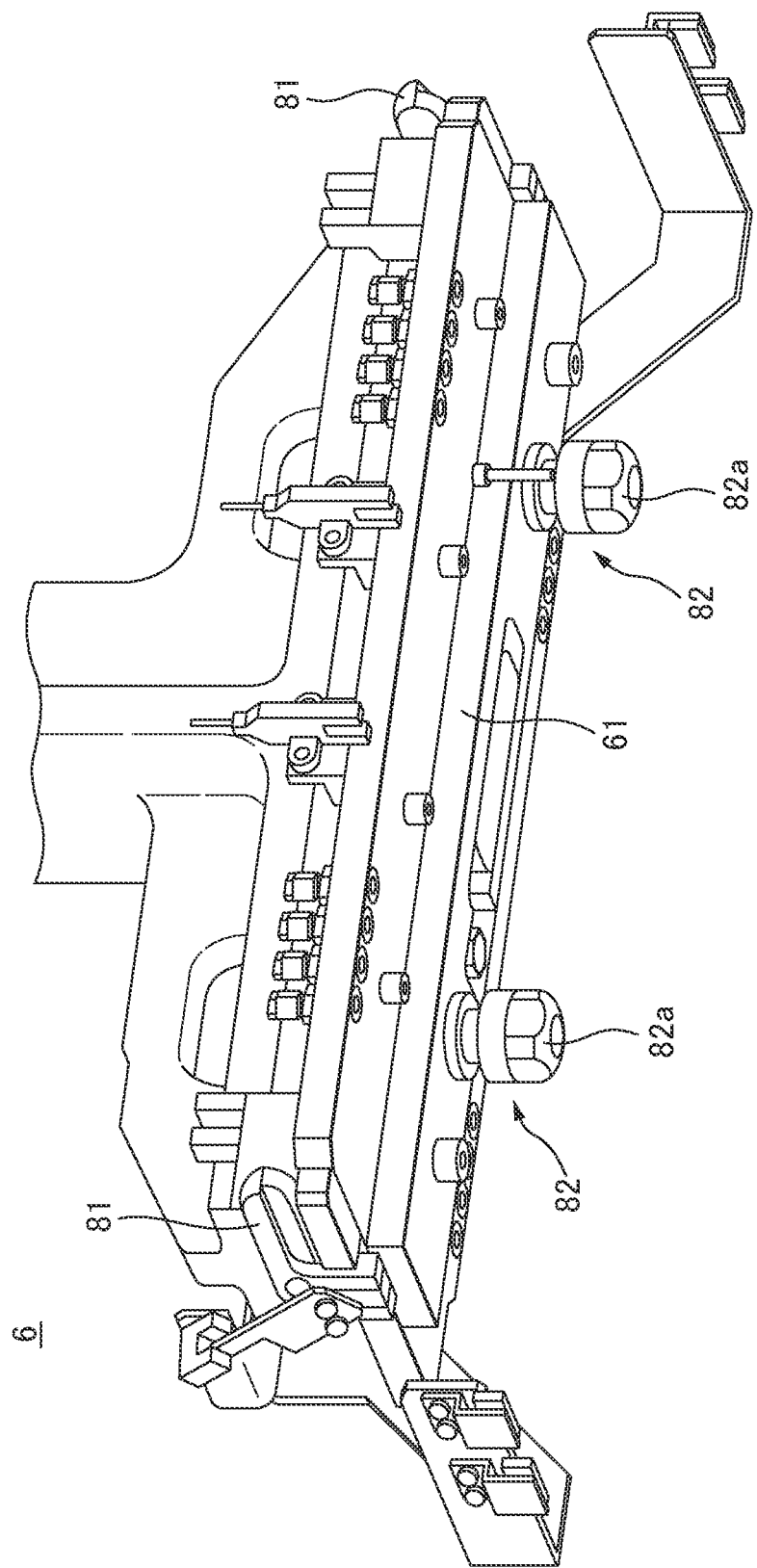
FIG. 5 is a perspective view of a movable arm in an IC handler of the present embodiment.
Figure 6:
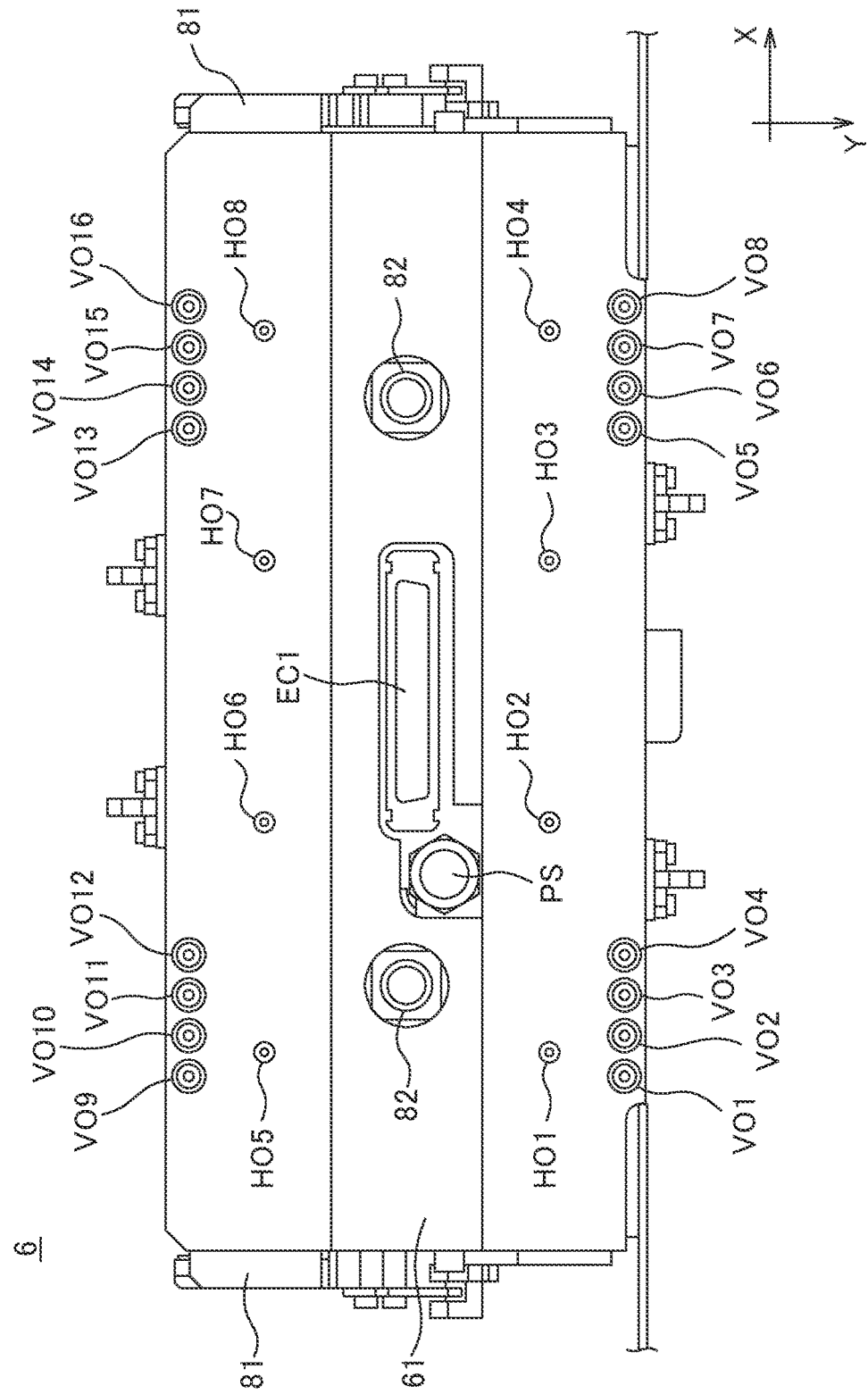
FIG. 6 is a bottom view of the movable arm of FIG. 5.

FIG. 5 is a perspective view showing only the movable arm 6 of an illustrative IC handler of the present embodiment, while FIG. 6 is a bottom view of a mounting part 61 in the movable arm 6 of FIG. 5. As shown in FIG. 5 and FIG. 6, the mounting part 61 of the movable arm 6 according to the present example is provided with clamp levers 81 able to rotate about an axis of rotation parallel to the X-direction and clamp shafts 82 able to move linearly in the Z-direction linked with the rotational motions of the clamp levers 81. The clamp levers 81 and clamp shafts 82 form part of the fastening mechanism part 8 for fastening the contact head 7 to the mounting part 61. Further, the clamp shafts 82 has flange parts 82a inserted in through holes 71g formed at the supporting section 71 of the contact head 7.

As shown in FIG. 6, the mounting part 61 according to the present example has a total of 16 supply ports VO supplying vacuum to the contact head 7 and a total of eight supply ports HO supplying hydraulic pressure to the contact head 7. More specifically, the mounting part 61 of the present example has two lines of supply ports VO side by side in the Y-direction. Each line includes two sets of supply ports VO arranged in the X-direction. Further, each set includes four supply ports VO arranged in the X-direction. Further, the mounting part 61 of the present example has two lines of supply ports HO side by side in the Y-direction. Each line includes four supply ports HO arranged in the X-direction. Below, the 16 vacuum supply ports VO shown in FIG. 6 will be referred to respectively as the supply ports VO1 to VO16 and the eight hydraulic supply ports HO will be referred to respectively as the supply ports HO1 to HO8. Further, the mounting part 61 of the present example can be further provided with a proximity sensor PS for confirming the mounting state of the contact head 7 and an electrical terminal EC1 for transfer of various control sensors and electrical signals at the contact head 7 side. The electrical terminal EC1 can be, for example, a D-sub (D-subminiature) terminal.

Figure 7:
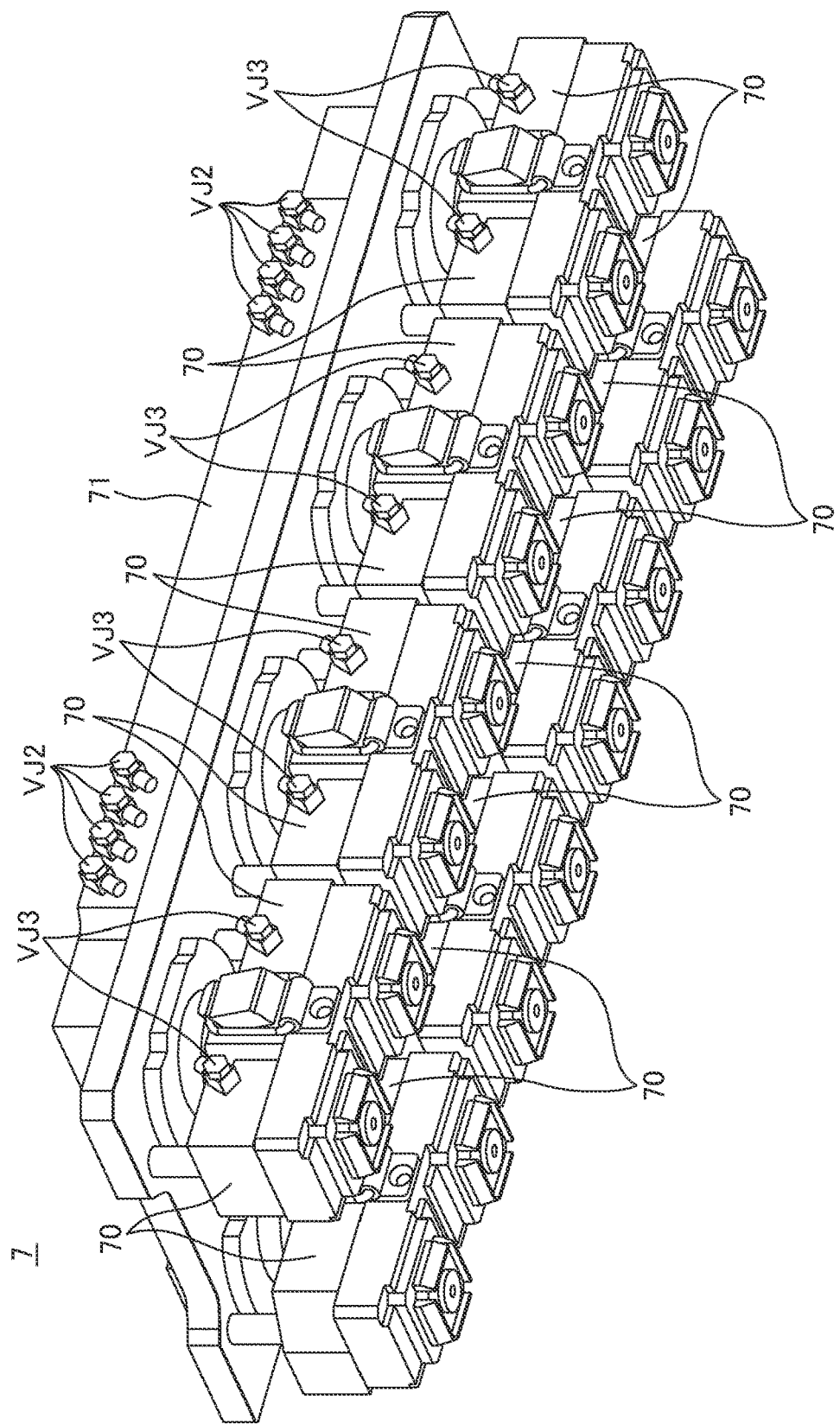
FIG. 7 is a perspective view of a first contact head in an IC handler of the present embodiment as seen from the bottom at a slant.
Figure 8:
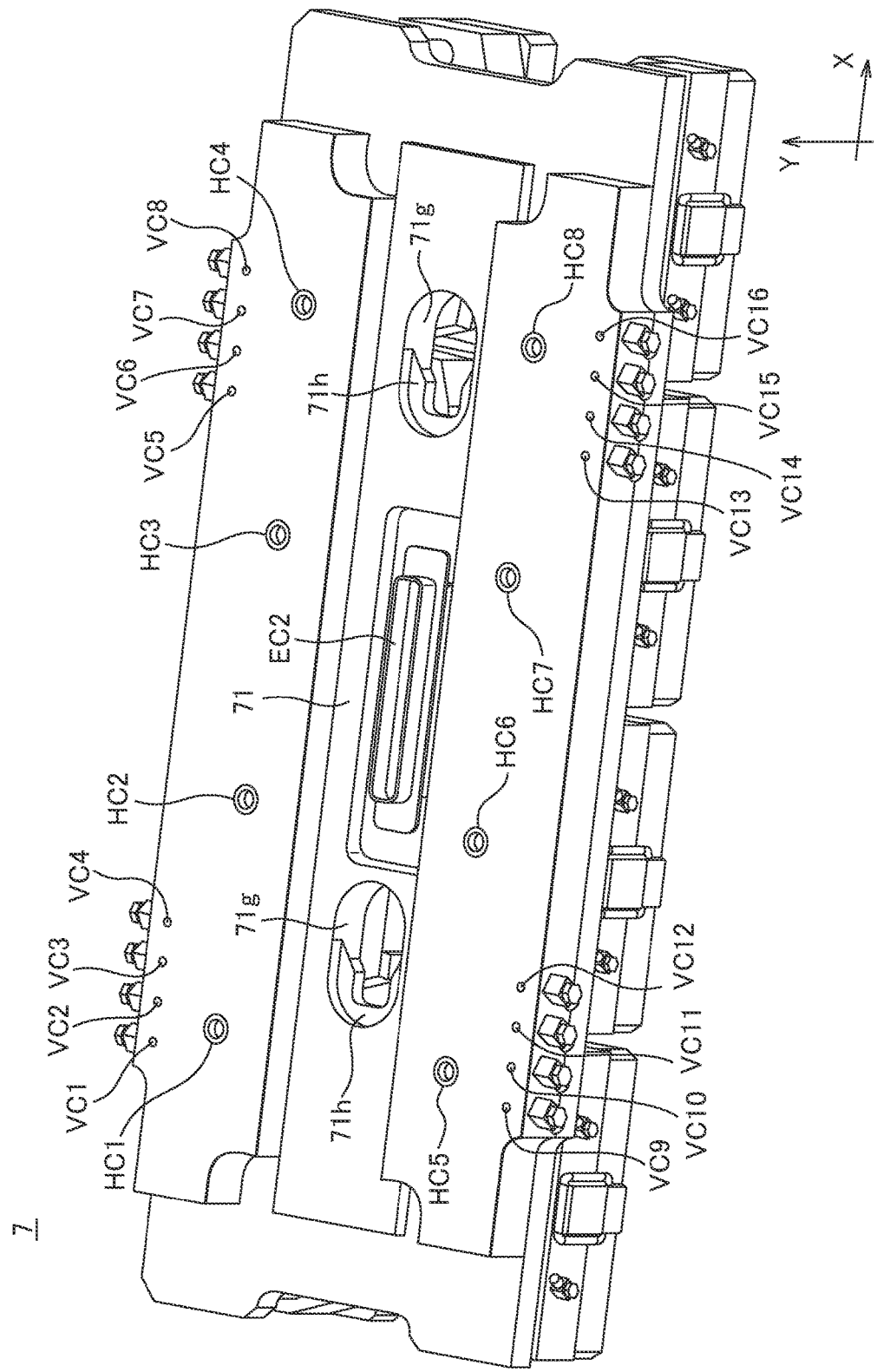
FIG. 8 is a perspective view of a first contact head in an IC handler of the present embodiment as seen from the bottom at a slant.

FIG. 7 and FIG. 8 are perspective views showing an example of a contact head 7 of the IC handler 4 of the present embodiment. Below, the contact head 7 of the present example will be called the "first contact head 7". FIG. 7 is a perspective view of the first contact head 7 seen from below at a slant, while FIG. 8 is a perspective view of the first contact head seen from above at a slant. "Above" referred to here indicates the supporting section 71 side of the contact head 7, while "below" indicates the operating section 70 side of the contact head 7. As shown in FIG. 7, the first contact head 7 according to the present example has 16 operating sections 70 supported by a common supporting section 71. Further, as shown in FIG. 8, at the supporting section 71 of the first contact head 7 according to the present example, through holes 71g in which the clamp shafts 82 at the movable arm 6 side are inserted are formed. At the inside circumferential surfaces of the through holes 71g, C-shaped clamp shaft holding parts 71h for holding the flange parts 82a of the clamp shafts 82 are formed. As shown in FIG. 8, the supporting section 71 of the first contact head 7 has 16 connection ports VC arranged so as to connect to the vacuum supply ports VO of the movable arm 6 side and eight connection ports HC arranged so as to connect to the hydraulic supply ports HO at the movable arm 6 side. Below, the 16 connection ports VC shown in FIG. 8 will be referred to as the connection ports VC1 to VC16 and the eight connection ports HC will be referred to as the connection ports HC1 to HC8. In the example of FIG. 8, the vacuum connection ports VC1 to VC16 are arranged so as to be respectively connected to the supply ports VO1 to VO16 at the movable arm 6 side, while the hydraulic connection ports HO1 to HO8 are arranged so as to be respectively connected to the supply ports HO1 to HO8 at the movable arm 6 side. As shown in FIG. 8, the supporting section 71 of the first contact head 7 has an electrical terminal E2 at the contact head 7 side connected to the electrical terminal E1 of the movable arm 6 side. Note that, in FIG. 7 and FIG. 8, the second vacuum tube VT2 is omitted.

Figure 9:
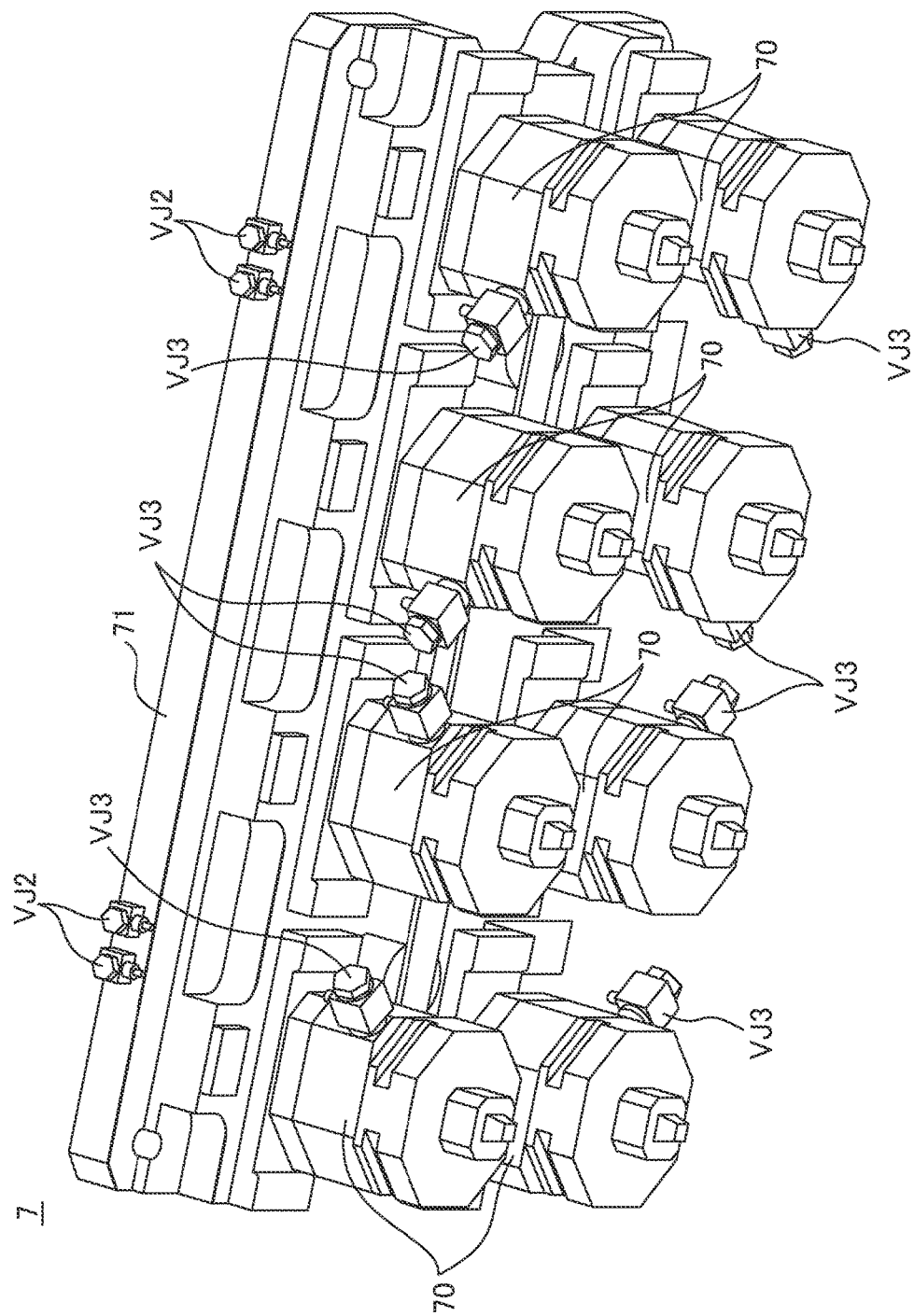
FIG. 9 is a perspective view of a second contact head in an IC handler of the present embodiment as seen from the bottom at a slant.
Figure 10:
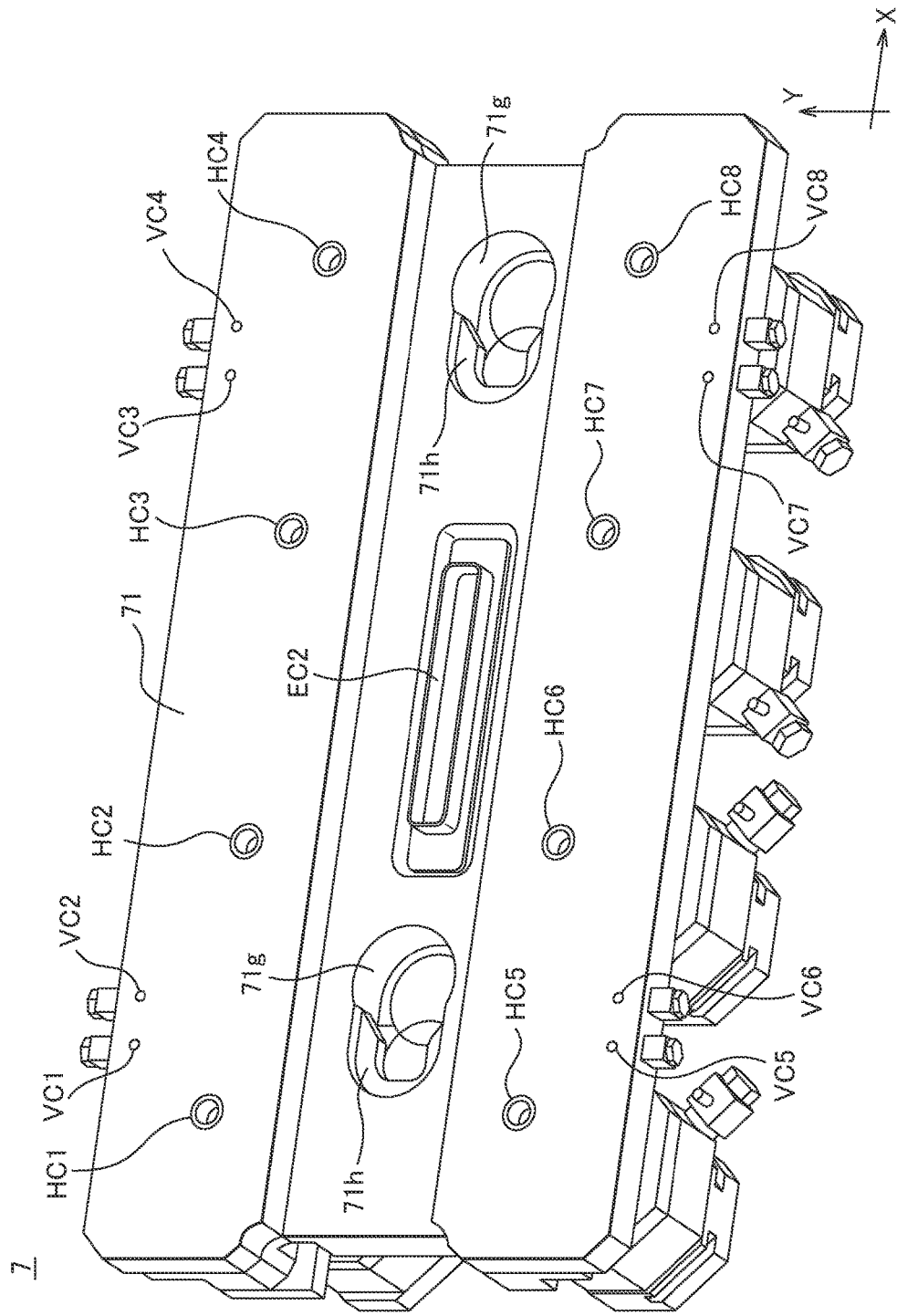
FIG. 10 is a perspective view of a second contact head in an IC handler of the present embodiment as seen from the bottom at a slant.

FIG. 9 and FIG. 10 are perspective views showing an example of a second contact head 7 able to be interchanged with the first contact head 7 shown in FIG. 7 and FIG. 8. FIG. 9 is a perspective view of the second contact head 7 seen from below at a slant, while FIG. 10 is a perspective view of the second contact head seen from above at a slant. As shown in FIG. 9, the second contact head 7 according to the present example has eight operating sections 70 supported by a common supporting section 71. Further, as shown in FIG. 10, at the supporting section 71 of the second contact head 7 according to the present example, through holes 71g in which the clamp shafts 82 at the movable arm 6 side are inserted are formed. At the inside circumferential surfaces of the through holes 71g, C-shaped clamp shaft holding parts 71h for holding the flange parts 82a of the clamp shafts 82 are formed.

As shown in FIG. 10, the supporting section 71 of the second contact head 7 has eight connection ports VC arranged so as to be connected to the vacuum supply ports VO at the movable arm 6 side and eight connection ports HC arranged so as to be connected to the hydraulic supply ports HO at the movable arm 6 side. Below, the eight connection ports VC shown in FIG. 10 will be called the connection ports VC1 to VC8 while the eight connection ports HC will be called the connection ports HC1 to HC8. In the example of FIG. 10, the vacuum connection ports VC1, VC2, VC3, VC4, VC5, VC6, VC7, and VC8 are arranged so as to be connected to the supply ports VO3, VO4, VO5, VO6, VO11, VO12, VO13, and VO14 at the movable arm 6 side, while the hydraulic connection ports HC1 to HC8 are arranged so as to be connected to the supply ports HO1 to HO8 at the movable arm 6 side. Further, the array of the vacuum connection ports VC1, VC2, VC3, VC4, VC5, VC6, VC7, and VC8 at the second contact head 7 of FIG. 10 matches the array of the vacuum connection ports VC3, VC4, VC5, VC6, VC11, VC12, VC13, and VC14 at the first contact head 7 of FIG. 8. In the same way, the array of the hydraulic connection ports HC1 to HC8 of the second contact head 7 of FIG. 10 matches the array of the hydraulic connection ports HC1 to HC8 at the first contact head 7 of FIG. 8. As shown in FIG. 10, the supporting section 71 of the second contact head 7 has an electrical terminal E2 at the contact head 7 side connected with the electrical terminal E1 at the movable arm 6 side. Note that, in FIG. 9 and FIG. 10, the second vacuum tube VT2 is omitted.

Figure 11:
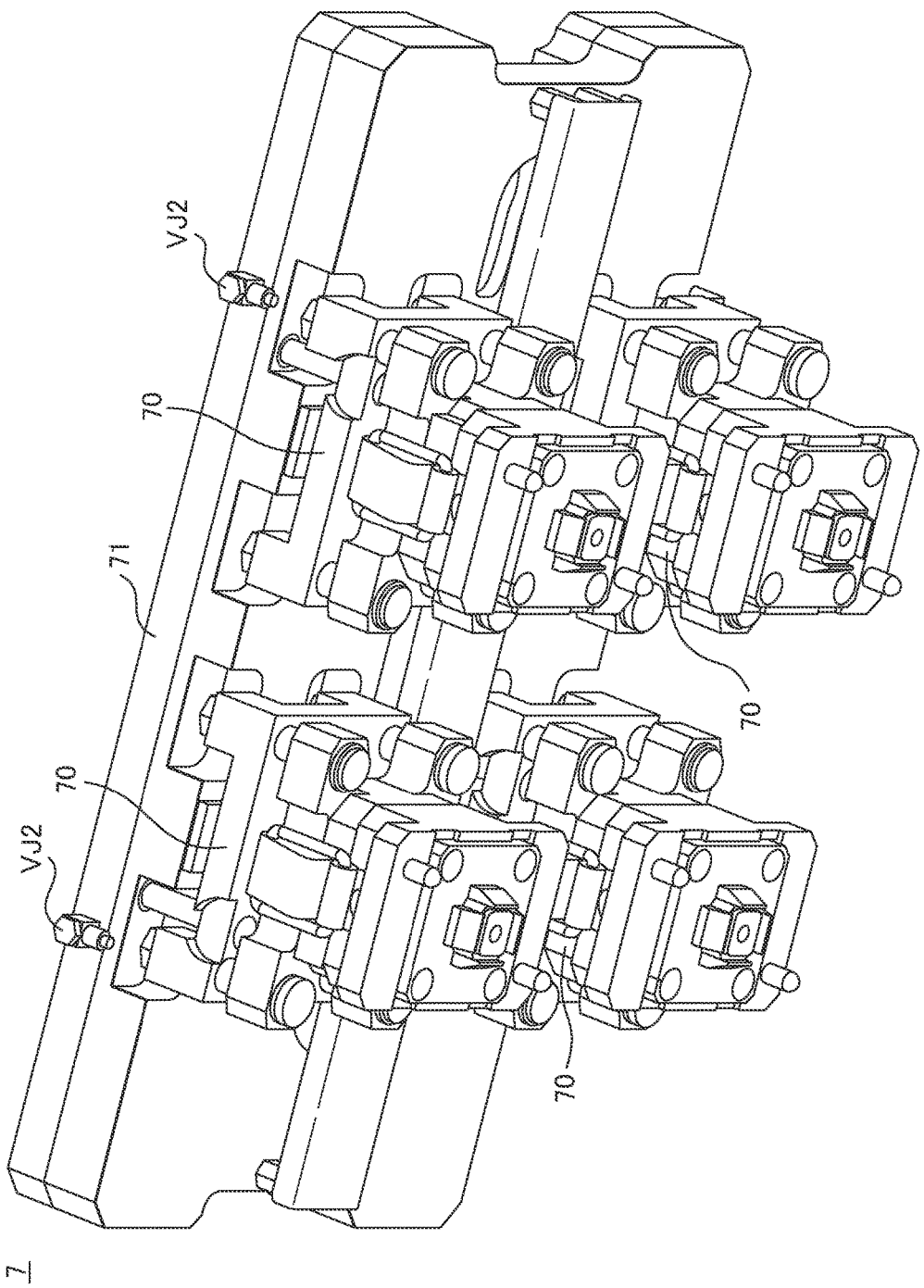
FIG. 11 is a perspective view of a third contact head in an IC handler of the present embodiment as seen from the bottom at a slant.
Figure 12:
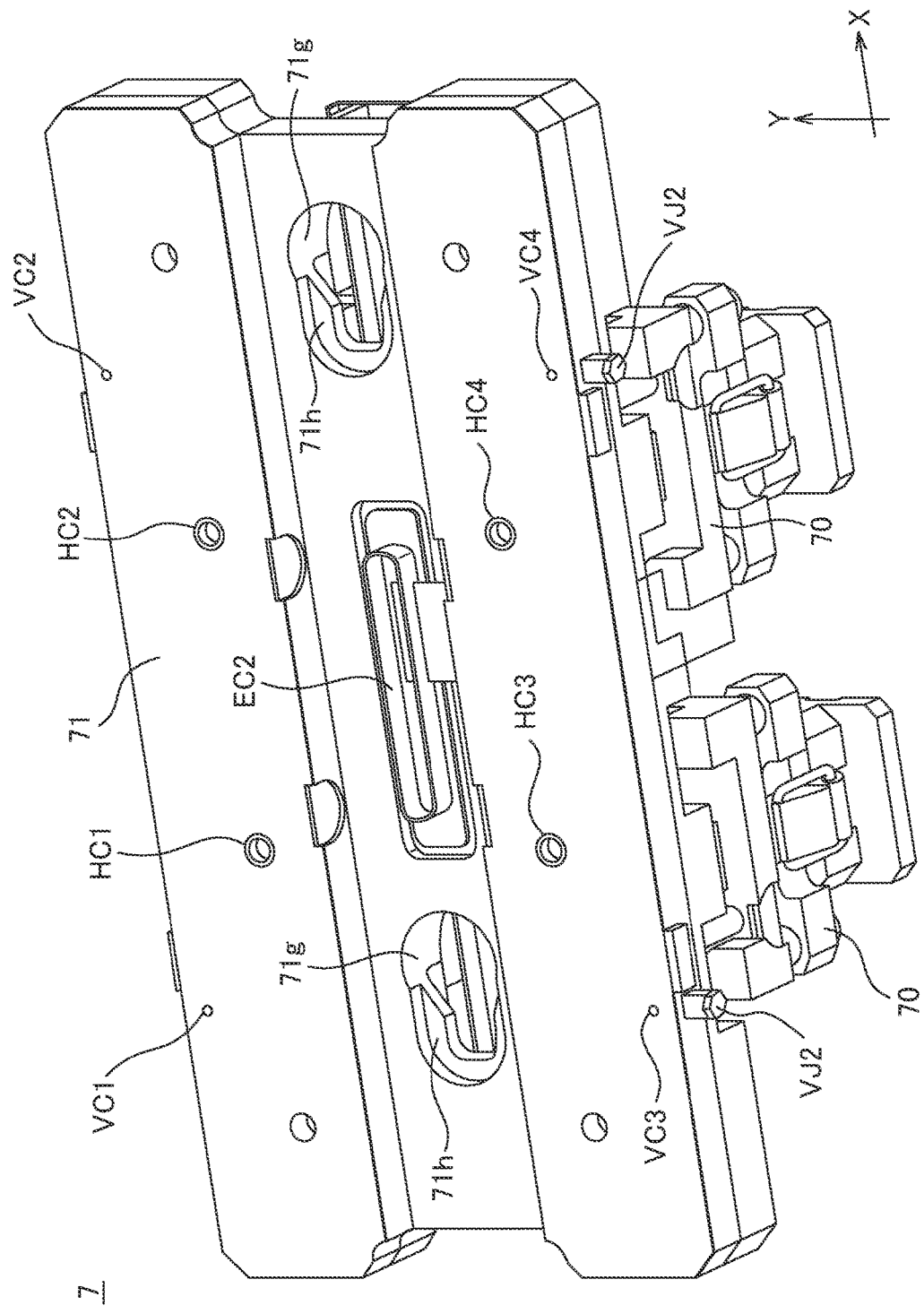
FIG. 12 is a perspective view of a third contact head in an IC handler of the present embodiment as seen from the bottom at a slant.

FIG. 11 and FIG. 12 are perspective views showing an example of a third contact head 7 able to be interchanged with the first contact head 7 shown in FIG. 7 and FIG. 8. FIG. 11 is a perspective view of the third contact head 7 seen from below at a slant, while FIG. 12 is a perspective view of the third contact head seen from above at a slant. As shown in FIG. 11, the third contact head 7 according to the present example has four operating sections 70 supported by a supporting section 71. Further, as shown in FIG. 12, at the supporting section 71 of the third contact head 7 according to the present example, through holes 71g in which the clamp shafts 82 at the movable arm 6 side are inserted are formed. At the inside circumferential surfaces of the through holes 71g, C-shaped clamp shaft holding parts 71h for holding the flange parts 82a of the clamp shafts 82 are formed.

As shown in FIG. 12, the supporting section 71 of the third contact head 7 has four connection ports VC arranged so as to be connected to the vacuum supply ports VO of the movable arm 6 side and four connection ports HC arranged so as to be connected to the hydraulic supply ports HO at the movable arm 6 side. Below, the four connection ports VC shown in FIG. 12 will be referred to as the connection ports VC1 to VC4 and the four connection ports HC will be referred to as the connection ports HC1 to HC4. In the example of FIG. 12, the vacuum connection ports VC1, VC2, VC3, and VC4 are arranged to be connected respectively to the supply ports VO4, VO5, VO12, and VO13 of the movable arm 6 side, while the hydraulic connection ports HC1, HC2, HC3, and HC4 are arranged to be connected respectively to the supply ports HO2, HO3, HO6, and HO7 of the movable arm 6 side. Further, the array of the vacuum connection ports VC1, VC2, VC3, and VC4 at the third contact head 7 of FIG. 12 matches the array of the vacuum connection ports VC4, VC5, VC12, and VC13 at the first contact head 7 of FIG. 8. In the same way, the array of the hydraulic connection ports HC1, HC2, HC3, and HC4 at the third contact head 7 of FIG. 12 matches the array of the hydraulic connection ports HC2, HC3, HC6, and HC7 at the first contact head 7 of FIG. 8. As shown in FIG. 12, the supporting section 71 of the third contact head 7 has an electrical terminal E2 of the contact head 7 side connected to the electrical terminal E1 of the movable arm 6. Note that, in FIG. 11 and FIG. 12, the second vacuum tube VT2 is omitted.

In the above way, the arrays of the connection ports VC and connection ports HC at the supporting section 71 are the same in all of the first to the third contact heads 7. Therefore, according to the IC handler 4 of the present embodiment, by just changing the contact head 7 attached to the movable arm 6 to another contact head 7, the connection ports VC and connection ports HC of the other contact head 7 are respectively connected to the supply ports VO and supply ports HO of the movable arm 6 side. Therefore, according to the IC handler 4 of the present embodiment, large scale work of altering the contact head 7 accompanying change of the array of DUTs becomes unnecessary, so it is possible to easily deal with various arrays of DUTs.

Figure 13:
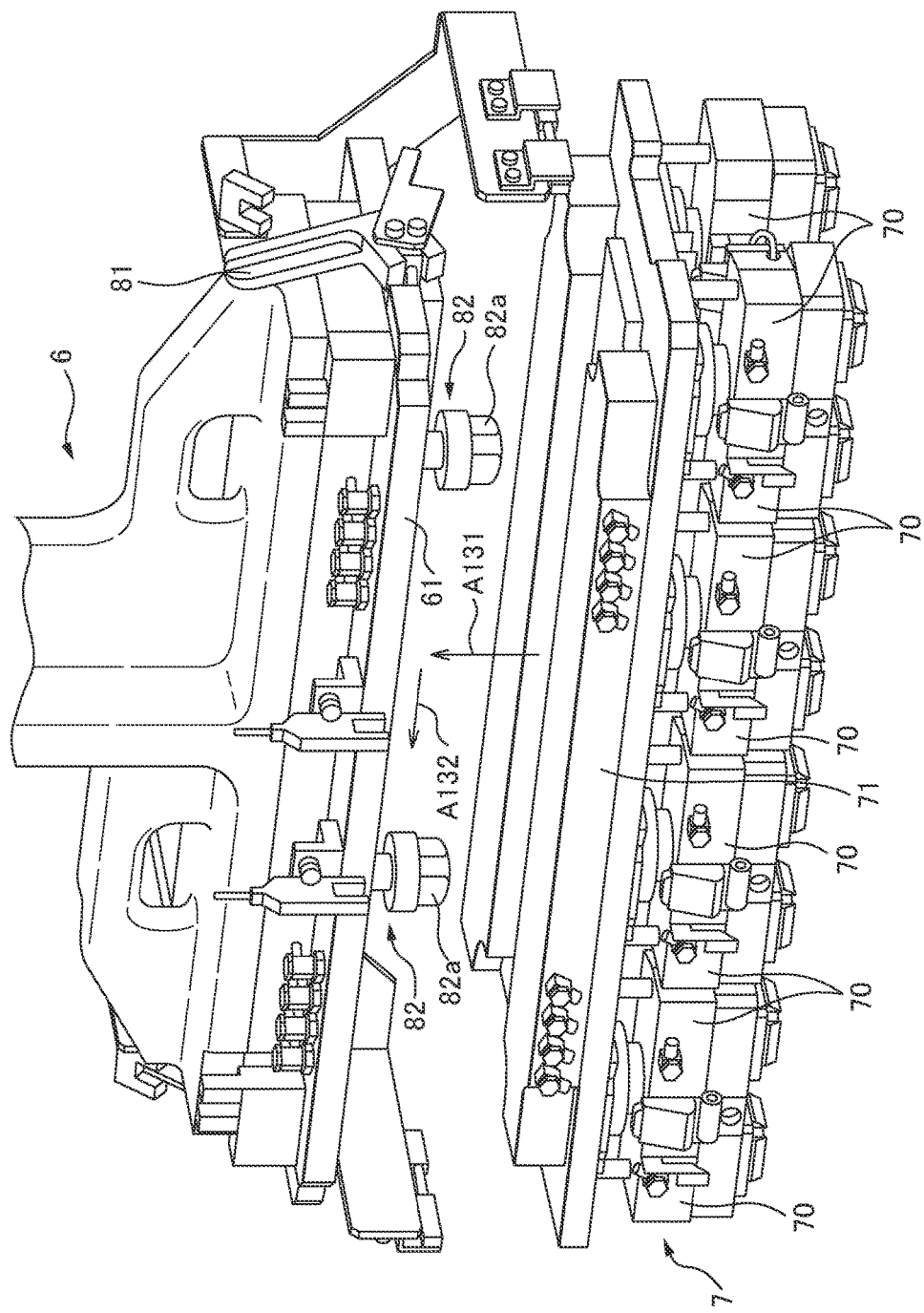
FIG. 13 is a perspective view showing the state where the contact head 7 is detached from the movable arm 6 in an IC handler of the present embodiment.
Figure 14:
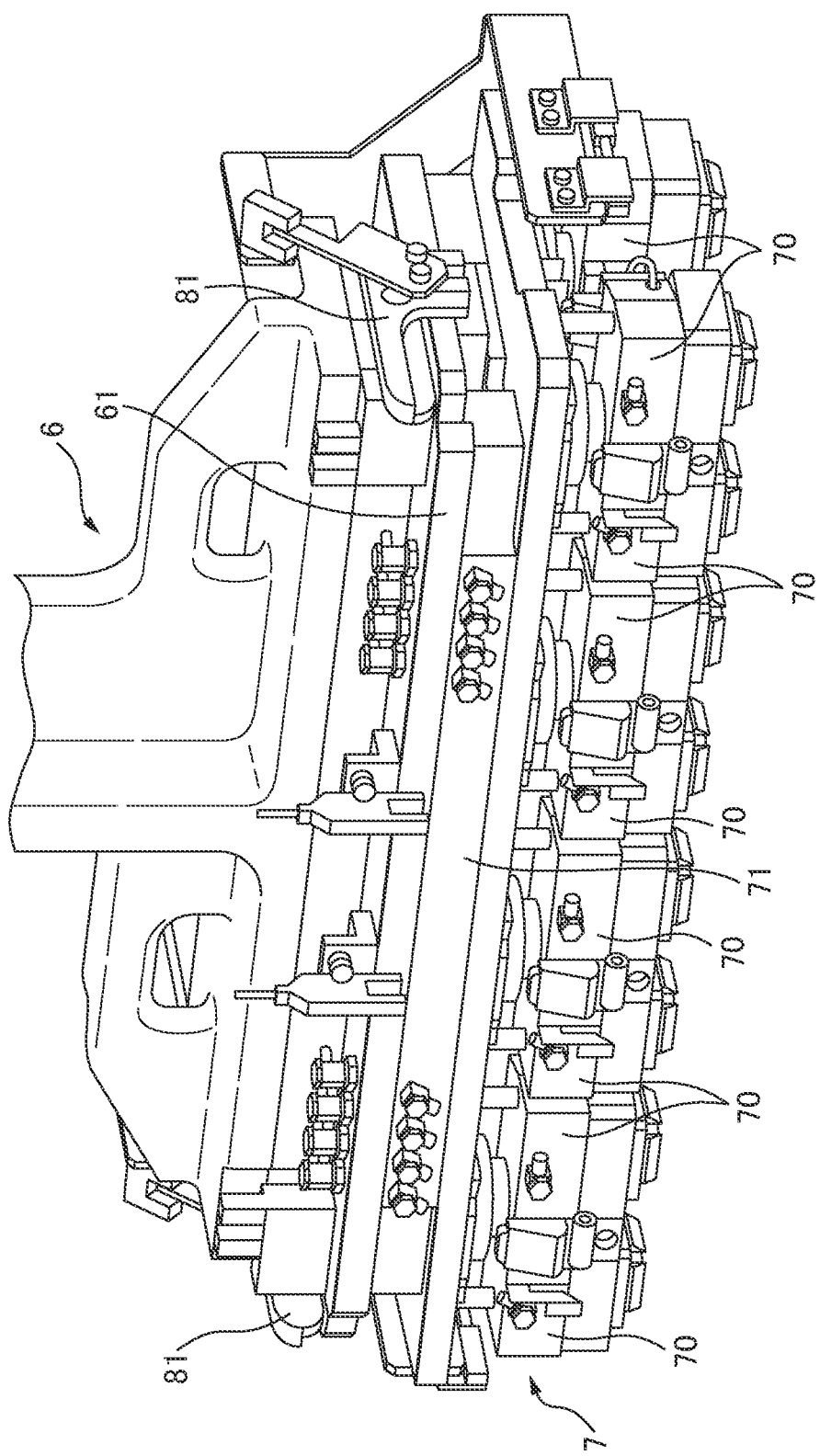
FIG. 14 is a perspective view showing the state where the contact head 7 is attached to the movable arm 6 in an IC handler of the present embodiment.

Next, the method of attaching the contact head 7 at the IC handler 4 of the present embodiment will be explained. FIG. 13 is a perspective view showing the state at an illustrative IC handler 4 of the present embodiment where the contact head 7 is detached from the movable arm 6, while FIG. 14 is a perspective view showing the state where the contact head 7 is attached to the movable arm 6. When the contact head 7 is attached to the movable arm 6, first, the contact head 7 is moved in the direction of the arrow A131 of FIG. 13 whereby the clamp shafts 82 of the movable arm 6 are inserted in through holes 71g of the supporting section 71 at the contact head 7 (see FIG. 8, FIG. 10, and FIG. 12). Next, if the contact head 7 is moved in the direction of the arrow A132 of FIG. 13, the flange parts 82a of the clamp shafts 82 become held by the clamp shaft holding parts 71h of the supporting section 71 (see FIG. 8, FIG. 10, and FIG. 12). Due to this, the contact head 7 is temporarily fastened with respect to the movable arm 6. At this point of time, the contact head 7 is not fastened with respect to the movable arm 6 and the connection port VC and connection port HC of the contact head 7 are not connected to the supply ports VO and HO of the movable arm 6 side. After that, the clamp lever 81 of the movable arm 6 is rotated, whereby the contact head 7 is fastened with respect to the movable arm 6.

Figure 15:
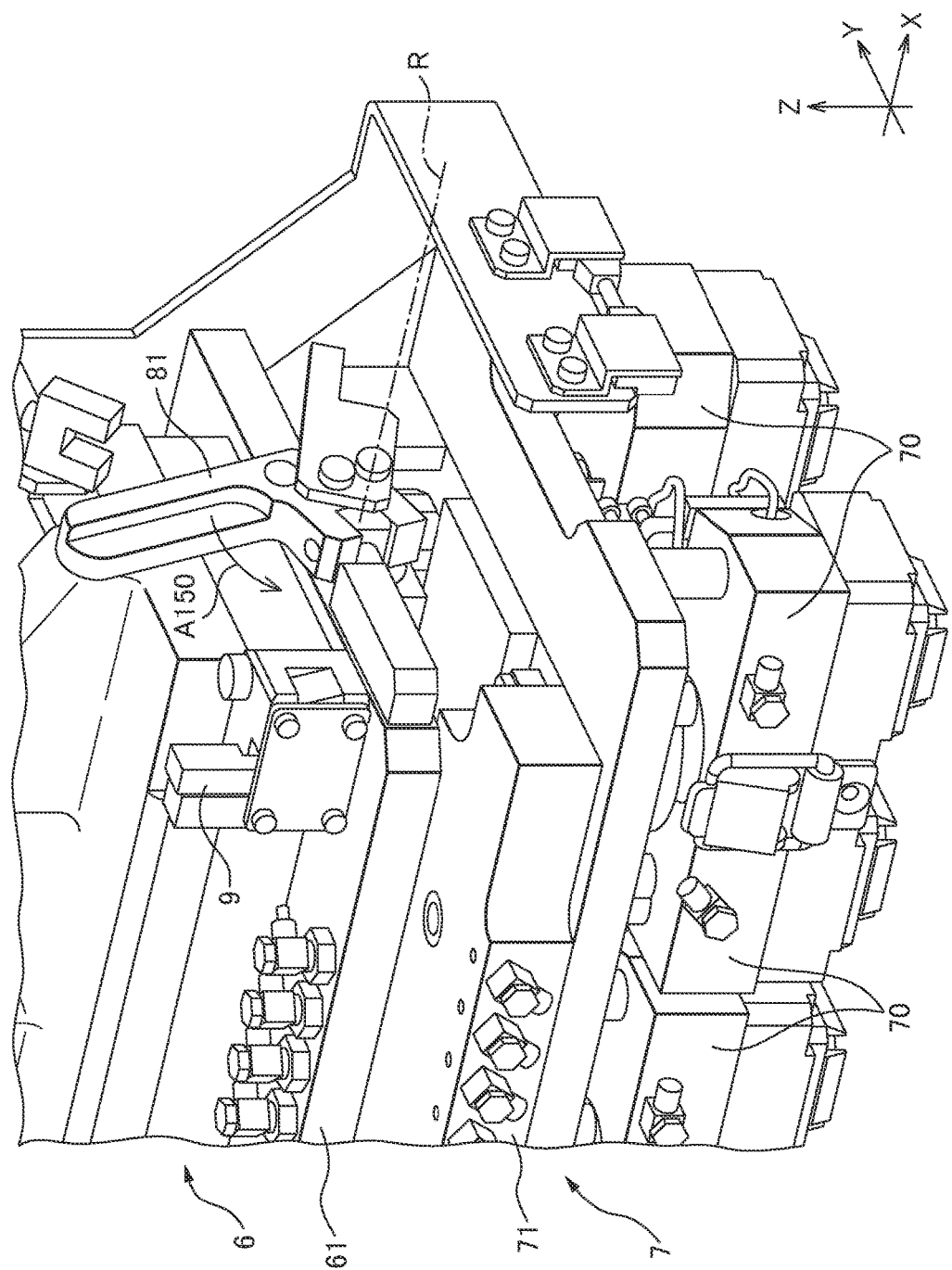
FIG. 15 is a perspective view showing enlarged the vicinity of a clamp lever in the movable arm of an IC handler of the present embodiment.
Figure 16:
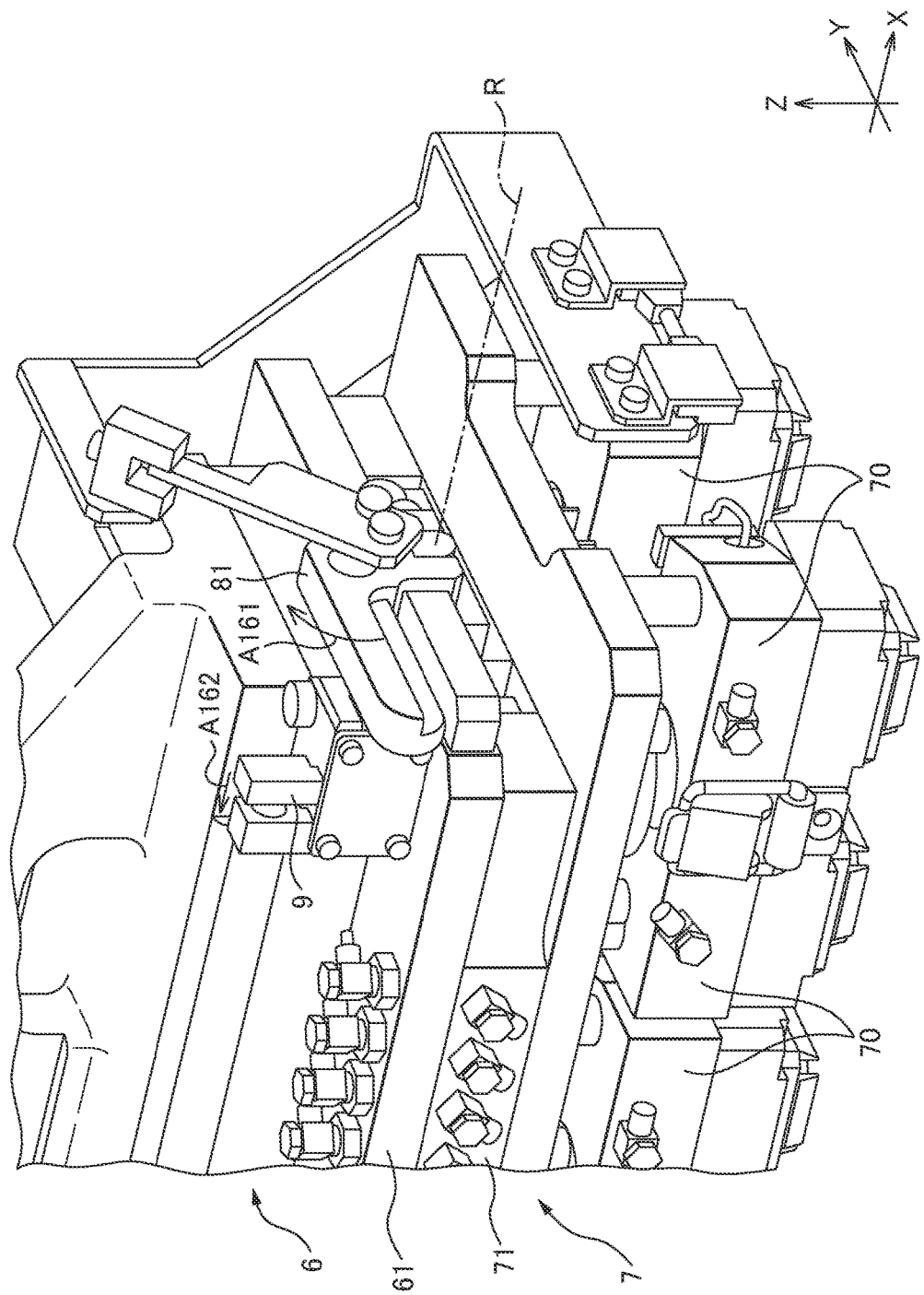
FIG. 16 is a perspective view similar to FIG. 15 and showing the state where the contact head is fastened to the movable arm.

FIG. 15 is a perspective view showing enlarged the vicinity of a clamp lever 81 at the movable arm 6 of FIG. 13 and shows the state where the contact head 7 is temporarily fastened at the movable arm 6, that is, the state before the contact head 7 is fastened to the movable arm 6. The position of the clamp lever 81 shown in FIG. 15 will be referred to below as the releasing position. Further, FIG. 16 is a perspective view similar to FIG. 15 and shows the state after the contact head 7 is fastened with respect to the movable arm 6. The position of the clamp lever shown in FIG. 16 will be referred to below as the fastening position. As will be understood from FIG. 15 and FIG. 16, the clamp lever 81 according to the present example can move between the releasing position and the fastening position by being rotated about the axis of rotation R parallel to the X-direction. Further, if the clamp lever is rotated in the direction shown by the arrow A150 of FIG. 15 and moved to the fastening position, the above-mentioned operation of the fastening mechanism part 8 enables the contact head 7 to be fastened with respect to the movable arm 6. On the other hand, if the clamp lever 81 is rotated in the direction shown by the arrow A161 of FIG. 16 and moved to the releasing position, the fastened state of the contact head 7 by the fastening mechanism part 8 is released. Note that, the mounting part 61 according to the present example is provided with a latch member 9 for latching the clamp lever 81 present at the fastening position in a releasable manner. Since the clamp lever 81 shown in FIG. 16 is latched by the latch member 9, it will never move to the releasing position. To make the clamp lever 81 present at the fastening position move to the releasing position, the latch member 9 has to be made to move in the direction of the arrow A162 of FIG. 16 to thereby release the clamp lever 81 from the state latched by the latch member 9.

Figure 17:
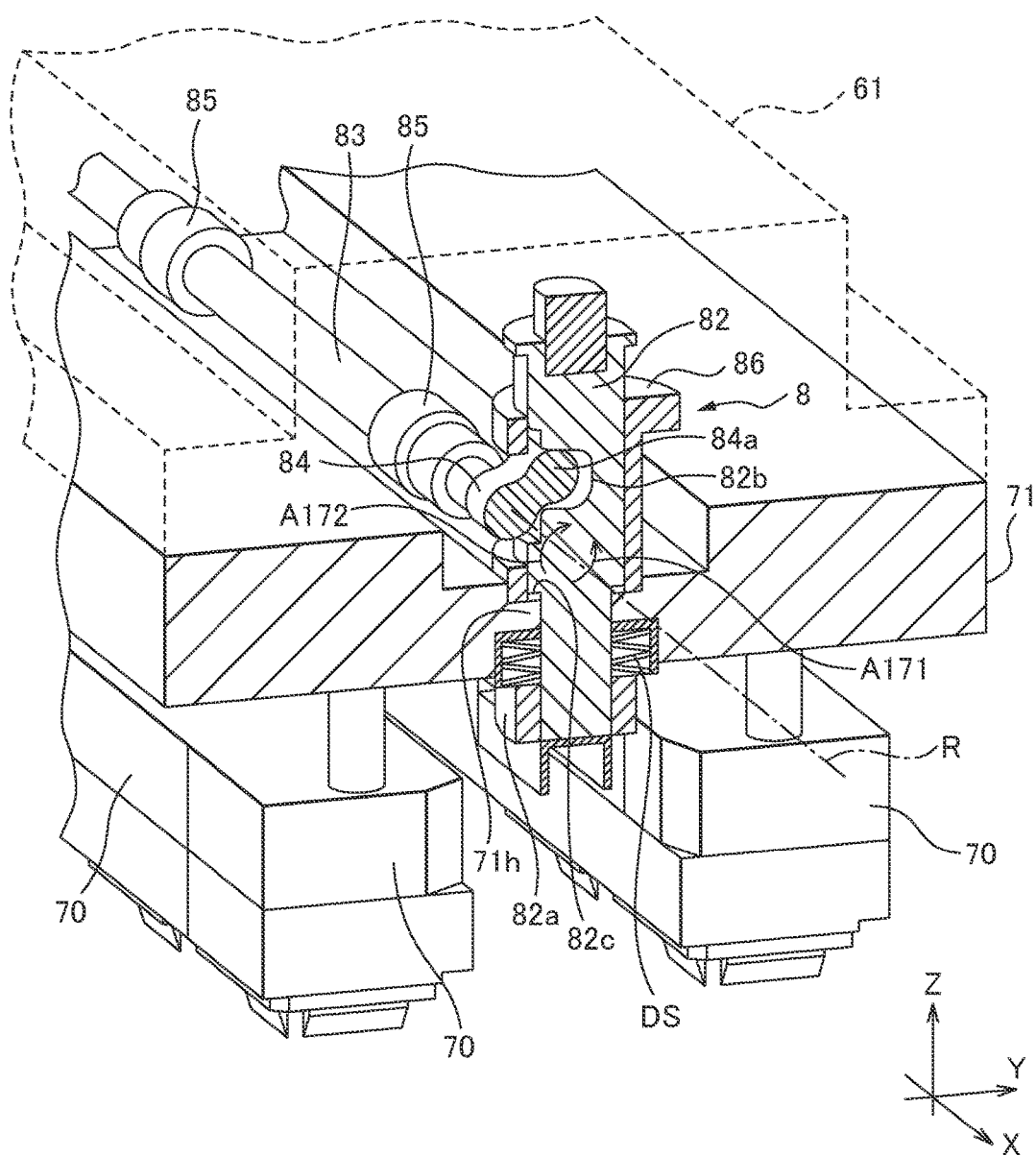
FIG. 17 is a view for explaining the operation of a fastening mechanism part in the movable arm of the IC handler of the present embodiment.

Next, the operation of the fastening mechanism part 8 at the mounting part 61 of the movable arm 6 will be explained. FIG. 17 is a view showing a cross-section along the YZ plane of the movable arm 6 and contact head 7 shown in FIG. 16. FIG. 17, in the same way as FIG. 16, shows the state after the contact head 7 is fastened with respect to the movable arm 6. In FIG. 17, for convenience, the parts of the fastening mechanism part 8 and contact head 7 are shown by solid lines and the outer shape of the mounting part 61 is shown by the broken lines. As shown in FIG. 17, the fastening mechanism part 8 according to the present example is provided with not only the above-mentioned clamp lever 81 and clamp shaft 82, but also a horizontal shaft 83 fastened to the clamp lever 81 and extending in the X-direction and a link member 84 fastened to the horizontal shaft 83 and extending vertical to the horizontal shaft 83. In the example of FIG. 17, the horizontal shaft 83 is supported by a bearing 85 fastened to the mounting part 61 to be able to rotate about the axis of rotation R, while the clamp shaft 82 is supported by a bearing 86 fastened to the mounting part 61 to be able to move linearly in the Z-direction. Further, at the front end part of the link member 84, a columnar cam part 84a having a centerline parallel to the X-direction is formed. At the clamp shaft 82, a groove part 82b extending in the X-direction is formed so as to accommodate a cam part 84a of the link member 84. Furthermore, between the groove part 82b and the flange part 82a in the direction of extension of the clamp shaft 82, a step difference 82c of the shape corresponding to the clamp shaft holding part 71h is formed.

According to the fastening mechanism part 8 of the present example, the rotational motion of the clamp lever 81 and horizontal shaft 83 about the axis of rotation R is converted to linear motion of the clamp shaft 82 in the Z-direction through the link member 84. More specifically, if the clamp lever 81 is moved from the releasing position to the fastening position, the horizontal shaft 83 is rotated in the direction of the arrow A171 of FIG. 17, so the cam part 84a of the link member 84 rolls against the recessed part 82b of the clamp shaft 82 while making the clamp shaft 82 move upward in the Z-direction. Due to this, the flange part 82a of the clamp shaft 82 pushes the clamp shaft holding part 71h of the supporting section 71 upward, so the supporting section 71 is fastened to the mounting part 61. After that, the clamp lever 81 is latched by the latch member 9 whereby the step of attachment of the contact head 7 is ended. Note that, in the example of FIG. 17, the flange part 82a of the clamp shaft 82 has a dish spring DS built into it. Due to the elastic recovery force of the dish spring DS, the contact head 7 is stably fastened with respect to the mounting part 61.

On the other hand, if the clamp lever 81 is moved from the fastening position to the releasing position, the horizontal shaft 83 is rotated in the direction of the arrow A172 of FIG. 17, so the cam part 84a of the link member 84 rolls against and contacts the recessed part 82b of the clamp shaft 82 while making the clamp shaft 82 move downward in the Z-direction. Due to this, the step difference 82c of the clamp shaft 82 pushes the clamp shaft holding part 71h of the supporting section 71 downward, so the supporting section 71 is made to separate from the mounting part 61 in the Z-direction. As a result, the contact head 7 is released from the fastened state by the fastening mechanism part 8 and temporarily fastened. After that, the contact head 7 is moved in the opposite direction from the direction shown by the arrow A131 and arrow A132 of FIG. 13 whereby the contact head 7 is detached from the movable arm 6. In this way, in the IC handler 4 of the present example, the contact head is detached by rotational motion of the clamp levers 81 not directly contacting the contact head 7. Therefore, even when high temperature tests of IC devices cause the contact head 7 to be heated, it becomes possible to easily and quickly detach the contact head 7.

In the above way, the contact head 7 of the IC handler 4 is detachably attached by the fastening mechanism part 8 to the movable arm 6. In the same way as this, the holder supporting part 53 at the shift unit 5 is detachably attached by the fastening mechanism part 54 to the base part 51 (see FIG. 1). FIG. 18 is a perspective view showing enlarged only the loading part 5a at the shift unit 5 of FIG. 1. As shown in FIG. 18, the loading part 5a of the present example is provided with the above-mentioned base part 51, plurality of holding parts 52, and holder supporting part 53 and also a fastening mechanism part 54 detachably attaching the holder supporting part 53 to the base part 51 in a detachable manner. Further, the fastening mechanism part 54 is provided with clamp levers 541 attached to the base part 51 and clamp blocks 542 interposed between the clamp lever 541 and the holder supporting part 53 and pushing the holder supporting part 53 against the base part 51.

The clamp levers 541 according to the example of FIG. 18 are rotated about axes of rotation parallel to the Z-direction whereby they can move between fastening positions for fastening the clamp blocks 542 and releasing positions for releasing the clamp blocks 542. FIG. 18 shows clamp levers 541 present at the fastening positions. Further, if the clamp levers 541 are moved to the releasing positions, the clamp blocks 542 are released from the clamp levers 541 and can move in the X-direction. Therefore, by making the clamp blocks 542 separate from the holder supporting part 53 in the X-direction, the holder supporting part 53 can be detached from the base part 51. After that, another holder supporting part 53 is arranged at the base part 51, then the clamp levers 541 are made to move again to the fastening positions whereby the other holder supporting part 53 can be attached to the base part 51. In this way, the IC handler 4 of the present embodiment is designed to enable easy replacement of not only the contact head 7, but also the holder supporting part 53 in accordance with a change of the array of DUTs.

The present invention is not limited to only the above embodiments and can be modified in various ways within the scope described in the claims. Further, the dimensions, shapes, material quality, etc. of the above-mentioned parts are just illustrations. Various dimensions, shapes, material qualities, etc. may be employed for achieving the advantageous effects of the present invention.

REFERENCE SIGNS LIST

1 IC test system
10 base 2 test head
3 socket
3a carrying surface
4 IC handler
5 shift unit
5a loading part
5b unloading part
51 base part
52 holding part
53 holder supporting part
54 fastening mechanism part
6 movable arm
61 mounting part
7 contact head
70 operating section
71 supporting section
71a supply path
71d supply path
72 clamping section
73 pushing section
8 fastening mechanism part
81 clamp lever
82 clamp shaft
83 horizontal shaft
84 link member
9 latch member
VO supply port
VC connection port
HO supply port
HC connection port

The invention claimed is:

1. An integrated circuit (IC) handler configured to convey a plurality of IC devices to a test head having a plurality of sockets, the IC handler comprising:
 a contact head for holding a plurality of IC devices and pushing the plurality of IC devices against said plurality of sockets, and
 a movable arm making said contact head move,
 wherein said movable arm has a supply port of power, said supply port connected to a supply source of power for enabling operation of said contact head,
 said contact head has a plurality of operating parts operating due to said power and a supporting section supporting said plurality of operating parts and attached detachably to said movable arm, each of said operating parts having a clamping section configured to clamp one of the plurality of IC devices and a pushing section configured to push said one of the plurality of IC devices against one of the plurality of sockets,
 said supporting section has a connection port detachably connected to said supply port and a supply path for supplying said power from said connection port connected to said supply port to said plurality of operating parts,
 said movable arm has a clamp lever able to rotate, a clamp shaft able to move linearly, and a link member converting rotational movement of said clamp lever to linear movement of said clamp shaft, and
 said clamp shaft pushes said supporting section to make it separate from said movable arm by said linear motion.

2. The IC handler according to claim 1, wherein said contact head can be replaced with another contact head differing in array of said plurality of operating parts at said supporting section, and
 the arrays of said connection ports at said supporting sections of said contact head and said other contact head match with each other.

3. The IC handler according to claim 1, wherein:
 said IC handler is further provided with a shift unit for conveying said plurality of IC devices relative to said movable arm,
 said shift unit is provided with a base part able to move with respect to said movable arm and a holder supporting part supporting a plurality of holding parts holding said plurality of IC devices individually and detachably attached to said base part, and
 the array of said plurality of holding parts supported by said holder supporting part and the array of said plurality of operating parts supported by said supporting section match with each other.

4. An integrated circuit (IC) handler configured to convey a plurality of IC devices to a test head having a plurality of sockets, the IC handler comprising:
 a contact head for holding a plurality of IC devices and pushing the plurality of IC devices against said plurality of sockets, and
 a movable arm making said contact head move,
 wherein said movable arm has a supply port of power, said supply port connected to a supply source of power for enabling operation of said contact head,
 said contact head has a plurality of operating parts operating due to said power and a supporting section supporting said plurality of operating parts and attached detachably to said movable arm, each of said operating parts configured to hold one of the plurality of IC devices and push said one of the plurality of IC devices against one of the plurality of sockets,
 said supporting section has a connection port detachably connected to said supply port and a supply path for supplying said power from said connection port connected to said supply port to said plurality of operating parts,
 said movable arm has a clamp lever able to rotate, a clamp shaft able to move linearly, and a link member converting rotational movement of said clamp lever to linear movement of said clamp shaft,
 said clamp shaft pushes said supporting section to make it separate from said movable arm by said linear motion, and wherein:
 said IC handler has interchangeable first and second contact heads as said contact head, and
 the arrays of said plurality of operating parts at said support parts of said first and second contact heads differ from each other and the array of said connection ports at said supporting sections of said first and second contact heads match with each other.

* * * * *